US012787573B2

(12) United States Patent
Kim et al.

(10) Patent No.: US 12,787,573 B2
(45) Date of Patent: Nov. 3, 2026

(54) DISPLAY APPARATUS

(71) Applicant: Samsung Display Co., Ltd., Yongin-Si (KR)

(72) Inventors: Daesuk Kim, Yongin-si (KR); Ilgoo Youn, Yongin-si (KR); Sukyo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 18/423,300

(22) Filed: Jan. 26, 2024

(65) Prior Publication Data

US 2024/0324338 A1 Sep. 26, 2024

(30) Foreign Application Priority Data

Mar. 24, 2023 (KR) ........................ 10-2023-0039176
Jul. 10, 2023 (KR) ........................ 10-2023-0089047

(51) Int. Cl.
*H10K 59/131* (2023.01)
*H10K 59/121* (2023.01)
*H10K 59/65* (2023.01)

(52) U.S. Cl.
CPC ....... *H10K 59/131* (2023.02); *H10K 59/1213* (2023.02); *H10K 59/1216* (2023.02); *H10K 59/65* (2023.02)

(58) Field of Classification Search
None
See application file for complete search history.

(56) References Cited

U.S. PATENT DOCUMENTS 10,879,332 B2 12/2020 Gu et al.
11,177,337 B2 11/2021 Seo et al.
11,430,858 B2 8/2022 Song et al.
2020/0411625 A1* 12/2020 Seo ...................... H10D 86/441
2023/0237964 A1 7/2023 Lee et al.

FOREIGN PATENT DOCUMENTS

KR 10-2018-0000771 A 1/2018
KR 10-2020-0021029 A 2/2020
KR 10-2021-0000799 A 1/2021
KR 10-2023-0114862 A 8/2023
KR 10-2023-0121203 A 8/2023

* cited by examiner

*Primary Examiner* — Bo B Jang
(74) *Attorney, Agent, or Firm* — Innovation Counsel LLP

(57) ABSTRACT

A display apparatus includes a substrate including a component area and a display area surrounding the component area, a driving voltage line extending in a first direction across the display area, a first horizontal connection line extending across the display area in a second direction and toward the component area, a first auxiliary horizontal connection line spaced apart from the first horizontal connection line, located between the first horizontal connection line and the component area, and extending in the second direction, and a transfer line extending in the second direction across the display area and toward the component area, and including a plurality of protrusions protruding in the first direction, wherein at least one of the plurality of protrusions is electrically connected to the first auxiliary horizontal connection line.

24 Claims, 23 Drawing Sheets

DISPLAY APPARATUS

CROSS-REFERENCE TO RELATED APPLICATION

This application is based on and claims priority under 35 U.S.C. § 119 to Korean Patent Application Nos. 10-2023-0039176 and 10-2023-0089047 filed on Mar. 24, 2023 and Jul. 10, 2023, respectively, in the Korean Intellectual Property Office, the disclosures of which are incorporated by reference herein in their entirety.

BACKGROUND

1. Field

One or more embodiments relate to a display apparatus, and more particularly, to a display apparatus capable of displaying a high-quality image.

2. Description of the Related Art

In general, in a display apparatus such as an organic light-emitting display apparatus, thin-film transistors are located in each (sub-)pixel to control the luminance of each (sub-)pixel. These thin-film transistors control the luminance of a corresponding (sub-)pixel according to a predefined source, such as a transmitted data signal.

SUMMARY

Conventional display apparatuses have problems in that they may not display high-quality images in some portions in a display area.

One or more embodiments provide a display apparatus capable of displaying a high-quality image. However, the embodiments are examples, and do not limit the scope of the disclosure.

Additional aspects will be set forth in part in the description which follows and, in part, will be apparent from the description, or may be learned by practice of the presented embodiments.

According to one aspect of the disclosure, a display apparatus includes a substrate including a component area and a display area around the component area, a driving voltage line extending in a first direction across the display area, a first horizontal connection line extending in a second direction intersecting the first direction and toward the component area, a first auxiliary horizontal connection line spaced apart from the first horizontal connection line, located between the first horizontal connection line and the component area, and extending in the second direction, and a transfer line extending in the second direction toward the component area, and including a plurality of protrusions protruding in the first direction, wherein at least one of the plurality of protrusions is electrically connected to the first auxiliary horizontal connection line.

One of the plurality of protrusions may be electrically connected to the first auxiliary horizontal connection line.

The at least one protrusion may be located farther from the component area than an end of the transfer line.

The transfer line and the first auxiliary horizontal connection line may be disposed on a same layer.

The transfer line and the first auxiliary horizontal connection line may be integrally formed as a single body.

The driving voltage line may be disposed on the transfer line.

The driving voltage line may be electrically connected to one of the plurality of protrusions of the transfer line through a contact hole.

The display apparatus may further include a plurality of pixel circuits located in the display area in rows extending in the second direction, wherein, when n is a natural number of 2 or more, the first auxiliary horizontal connection line located in an $n^{th}$ row is electrically connected to the transfer line located in an $n-1^{th}$ row.

The display apparatus may further include a vertical connection line extending across the display area in the first direction and electrically connected to the first horizontal connection line.

The vertical connection line and the driving voltage line may be disposed on a same layer.

The display apparatus may further include a second horizontal connection line extending across the display area in the second direction, wherein the substrate further includes a peripheral area outside the display area, wherein a first end of the second horizontal connection line is located in the peripheral area on one side of the display area, and a second end of the second horizontal connection line is located in the peripheral area on the other side of the display area.

At least one of the first end and the second end of the second horizontal connection line may be electrically connected to a constant voltage line in the peripheral area.

Both ends of the first horizontal connection line may be located in the display area.

The one end of the first horizontal connection line that is farther from the component area than the other end may be located in the display area.

The display apparatus may further include a first additional horizontal connection line spaced apart from the first horizontal connection line, located between the first horizontal connection line and the peripheral area, and extending in the second direction.

An end of the first additional horizontal connection line farthest away from the component area may be located in the peripheral area on a side of the display area.

The end of the first additional horizontal connection line may be electrically connected to a constant voltage line in the peripheral area.

According an aspect of the disclosure, a display apparatus includes a substrate, a driving voltage line extending across a display area in a first direction, a first component area and a second component area spaced apart from each other in a second direction intersecting the first direction, the display area around the first component area and the second component area, a horizontal connection line extending across the display area in the second direction and located between the first component area and the second component area, and a transfer line extending in the second direction to cross the display area and be located between the first component area and the second component area, corresponding to the horizontal connection line, and including a plurality of protrusions protruding in the first direction, wherein at least one of the plurality of protrusions is electrically connected to the horizontal connection line.

One of the plurality of protrusions may be electrically connected to the horizontal connection line.

The transfer line and the horizontal connection line may be disposed on a same layer.

The transfer line and the horizontal connection line may be integrally formed as a single body.

The driving voltage line may be disposed over the transfer line.

The driving voltage line may be electrically connected to one of the plurality of protrusions of the transfer line through a contact hole.

The display apparatus may further include a plurality of pixel circuits located in the display area in rows extending in the second direction, wherein, when n is a natural number of 2 or more, the horizontal connection line located in an $n^{th}$ row is electrically connected to the transfer line located in an $n-1^{th}$ row.

Other aspects, features, and advantages of the disclosure will become more apparent from the detailed description, the claims, and the drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
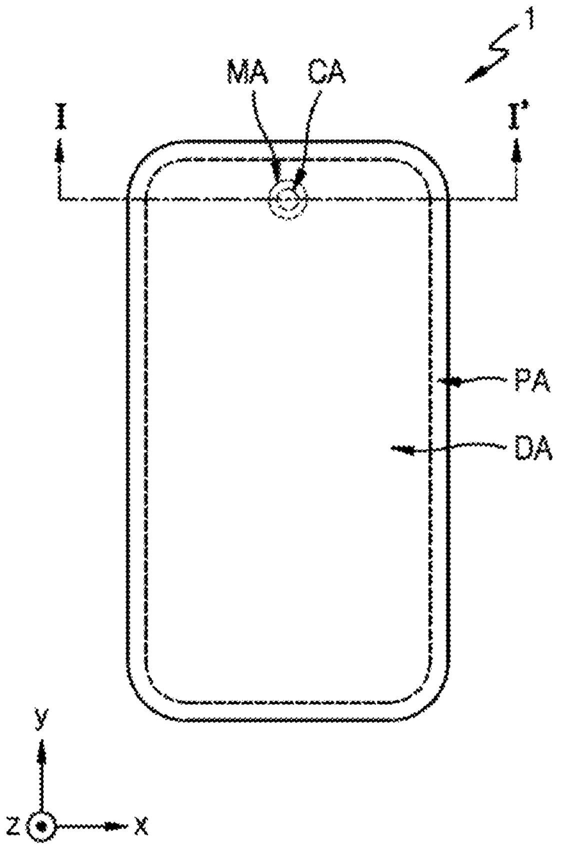
FIG. 1 is a plan view schematically illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a redundant description is omitted.

It will be understood that when a component, such as a layer, a film, a region, or a plate, is referred to as being "on" another component, the component may be directly on the other component or intervening components may be present therebetween. Also, sizes of components in the drawings may be exaggerated or reduced for convenience of explanation. For example, because sizes, shapes, and thicknesses of elements in the drawings are arbitrarily selected for convenience of explanation, the disclosure is not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. A positive direction along each of the axes (x-direction, y-direction) indicates the direction as shown by the arrow in the coordinate system. A negative direction along each of the axes (−x-direction, −y-direction) indicates a direction that is opposite the direction of the arrows in the coordinate system.

Although the terms "first," "second," etc. may be used to describe various elements, these elements should not be limited to any order by these terms. These terms are only used to distinguish one element from another.

It will be further understood that the terms "comprises" or "comprising" used herein specify the presence of stated features or components, but do not preclude the presence or addition of one or more other features or components.

"A and/or B" is used herein to select only A, select only B, or select both A and B. "At least one of A and B" is used to select only A, select only B, or select both A and B.

It will be understood that when a layer, region, or component is referred to as being "connected," the layer, the region, or the component may be directly connected or may be indirectly connected with intervening layers, regions, or components therebetween. For example, when layers, regions, or components are referred to as being "electrically connected," the layers, the regions, or the components may be directly electrically connected, or may be indirectly electrically connected with intervening layers, regions, or components therebetween.

FIG. 1 is a plan view schematically illustrating a display apparatus 1, according to an embodiment. The display apparatus 1 according to the present embodiment may be an electronic device such as a smartphone, a mobile phone, a navigation device, a game console, a TV, a vehicle head unit, a notebook computer, a laptop computer, a tablet computer, a personal media player (PMP), or a personal digital assistant (PDA). Also, the display apparatus 1 according to the present embodiment may be a center information display (CID) located on an instrument panel, a center fascia, or a dashboard of a vehicle, a room mirror display replacing a side-view mirror of a vehicle, or an electronic device located on the back of a front seat for entertainment for a person in a back seat of a vehicle. Also, the electronic device may be a flexible device. In FIG. 1, the display apparatus 1 according to the present embodiment is, for example, a smartphone.

The display apparatus 1 may include a display area DA and a peripheral area PA outside the display area DA. In a plan view, the display area DA may have a substantially rectangular shape as shown in FIG. 1. However, the disclosure is not limited thereto, and the display area DA may have a polygonal shape such as a triangular shape, a pentagonal shape, or a hexagonal shape, a circular shape, an elliptical shape, or an irregular shape. The display area DA may have a shape with round corners. The peripheral area PA may be a non-display area where display elements are not located. The display area DA may be entirely surrounded by the peripheral area PA.

Pixels including various display elements such as an organic light-emitting diode (OLED) may be located in the display area DA. The pixels may be arranged in any of various forms such as a stripe arrangement, a pentile arrangement, or a mosaic arrangement in an x-axis direction and a y-axis direction, to display an image.

A component area CA may be located in an area that is at least partially surrounded by the display area DA. The component area CA is not part of the display area DA and the two areas are mutually exclusive. The component area CA may be defined by an opening of a substrate 100 (see FIGS. 3 and 14) included in the display apparatus 1. The component area CA is located in an upper middle portion of the display area DA, as shown in FIG. 1. However, the component area CA may be located in different locations. For example, the component area CA may be located in an upper left portion of the display area DA or located in an upper right portion of the display area DA. Although one component area CA is located in the display area DA in FIG. 1, the display apparatus 1 may include a plurality of component areas CA.

An intermediate area MA may be located between the display area DA and the component area CA. The intermediate area MA may have a closed-loop shape entirely surrounding the component area CA in plan view.

Figure 2:
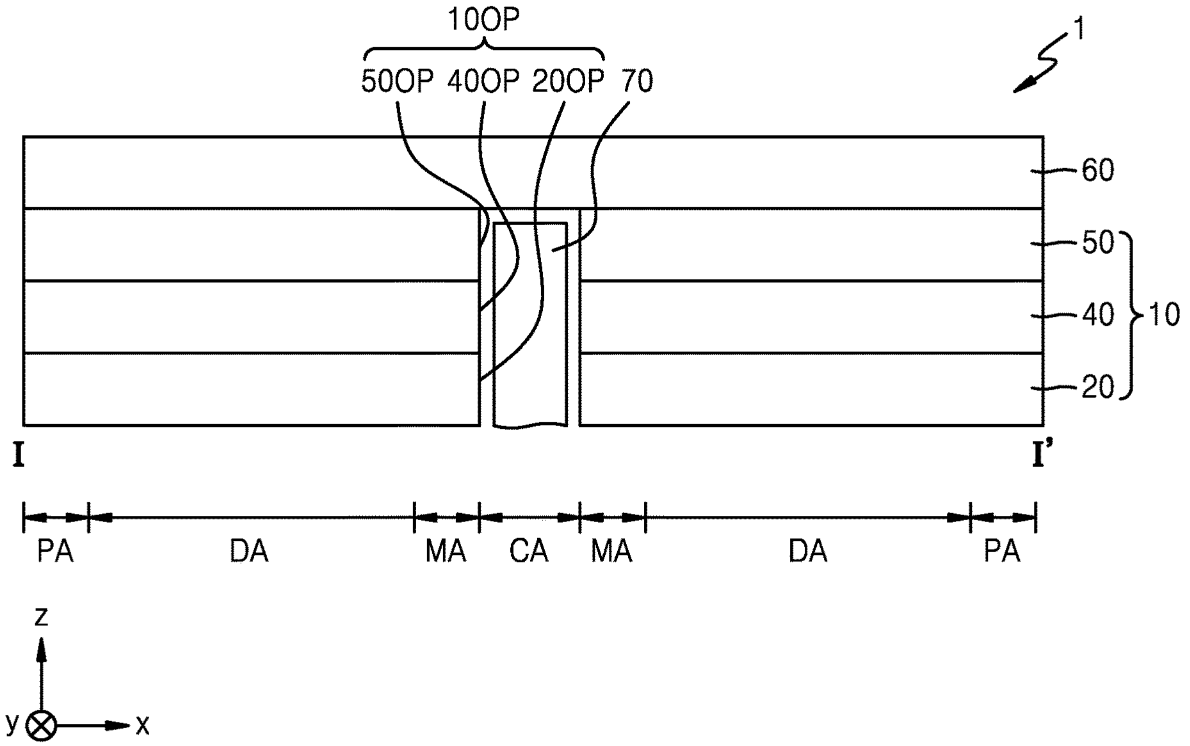
FIG. 2 is a schematic cross-sectional view taken along line I-I' of the display apparatus of FIG. 1.

FIG. 2 is a schematic cross-sectional view taken along line I-I' of the display apparatus 1 of FIG. 1. As described above, the display apparatus 1 may include a display panel 10, a cover window 60, and a component 70 located in the component area CA of the display panel 10. The display panel 10, the cover window 60, and the component 70 may be accommodated in a housing (not shown).

The display panel 10 may include an image generating layer 20, an input sensing layer 40, and an optical functional layer 50.

The image generating layer 20 may include display elements (or light-emitting elements) that emit light to display an image. The display element may include a light-emitting diode, for example, an organic light-emitting diode including an organic emission layer. In another embodiment, the display element may be an inorganic light-emitting diode including an inorganic material. The inorganic light-emitting diode may include a PN junction diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers, or several to hundreds of nanometers.

However, the disclosure is not limited thereto. For example, the image generating layer 20 may include a quantum dot layer. That is, light having a wavelength belonging to a specific wavelength band generated in an emission layer included in the image generating layer 20 may be converted into light having a preset wavelength by the quantum dot layer.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may detect an external input by using a mutual capacitance method and/or a self-capacitance method.

The input sensing layer 40 may be located on the image generating layer 20. The input sensing layer 40 may be formed directly on the image generating layer 20, or may be separately formed and then may be attached to the image generating layer 20 through an adhesive layer such as an optically clear adhesive. In the former case, the input sensing layer 40 may be continuously formed after the image generating layer 20 is formed, and in this case, the adhesive layer may not be located between the input sensing layer 40 and the image generating layer 20. For reference, although the input sensing layer 40 is located between the image generating layer 20 and the optical functional layer 50 in FIG. 2, various modifications may be made. For example, the input sensing layer 40 may be located over the optical functional layer 50.

The optical functional layer 50 may include an anti-reflection layer. The anti-reflection layer may reduce a reflectance of light (external light) incident on the display panel 10 through the cover window 60. The anti-reflection layer may include a phase retarding film and a polarizing film. Alternatively, the anti-reflection layer may include a black matrix and color filters. In the latter case, the color filters may be arranged in consideration of a color of light emitted from the image generating layer 20.

The display panel 10 may include an opening 10OP to increase a transmittance of the component area CA. Because the display panel 10 includes the opening 10OP, the substrate 100, which is an element of the image generating layer 20 included in the display panel 10, may also have such an opening as described above. The opening 10OP may include a first opening 20OP passing through the image generating layer 20, a second opening 40OP passing through the input sensing layer 40, and a third opening 50OP passing through the optical functional layer 50. That is, the first opening 20OP passing through the image generating layer 20, the second opening 40OP passing through the input sensing layer 40, and the third opening 50OP passing through the optical functional layer 50 may overlap each other, to form the opening 10OP of the display panel 10.

The cover window 60 may be located on the display panel 10, specifically, on the optical functional layer 50. The cover window 60 may be attached to the optical functional layer 50 through an adhesive layer such as an optically clear adhesive (OCA). The cover window 60 may cover the first opening 20OP passing through the image generating layer 20, the second opening 40OP passing through the input sensing layer 40, and the third opening 50OP passing through the optical functional layer 50. The cover window 60 may include glass or plastic. When the cover window 60 includes glass, the cover window 60 may include ultra-thin glass. When the cover window 60 includes plastic, the cover window 60 may include polyethersulfone, polyacrylate, polyetherimide, polyethylene naphthalate, polyethylene terephthalate, polyphenylene sulfide, polyarylate, polyimide, polycarbonate, or cellulose acetate propionate.

The component area CA may be a component area (e.g., a sensor area, a camera area, a speaker area, etc.) in which the component 70 for adding various functions to the display apparatus 1 is located.

The component 70 that is an electronic element may be located to correspond to the component area CA (in a −z direction). The component 70 may be a camera or a sensor that is an electronic element using light or sound. Examples of the sensor may include a proximity sensor for measuring a distance and an illuminance sensor for measuring brightness. The electronic element using light may use light of any of various wavelength bands such as visible light, infrared light, or ultraviolet light. The component area CA may allow light and/or sound to be output from the component 70 to the outside or may allow external light and/or sound to travel toward the component 70.

Figure 3:
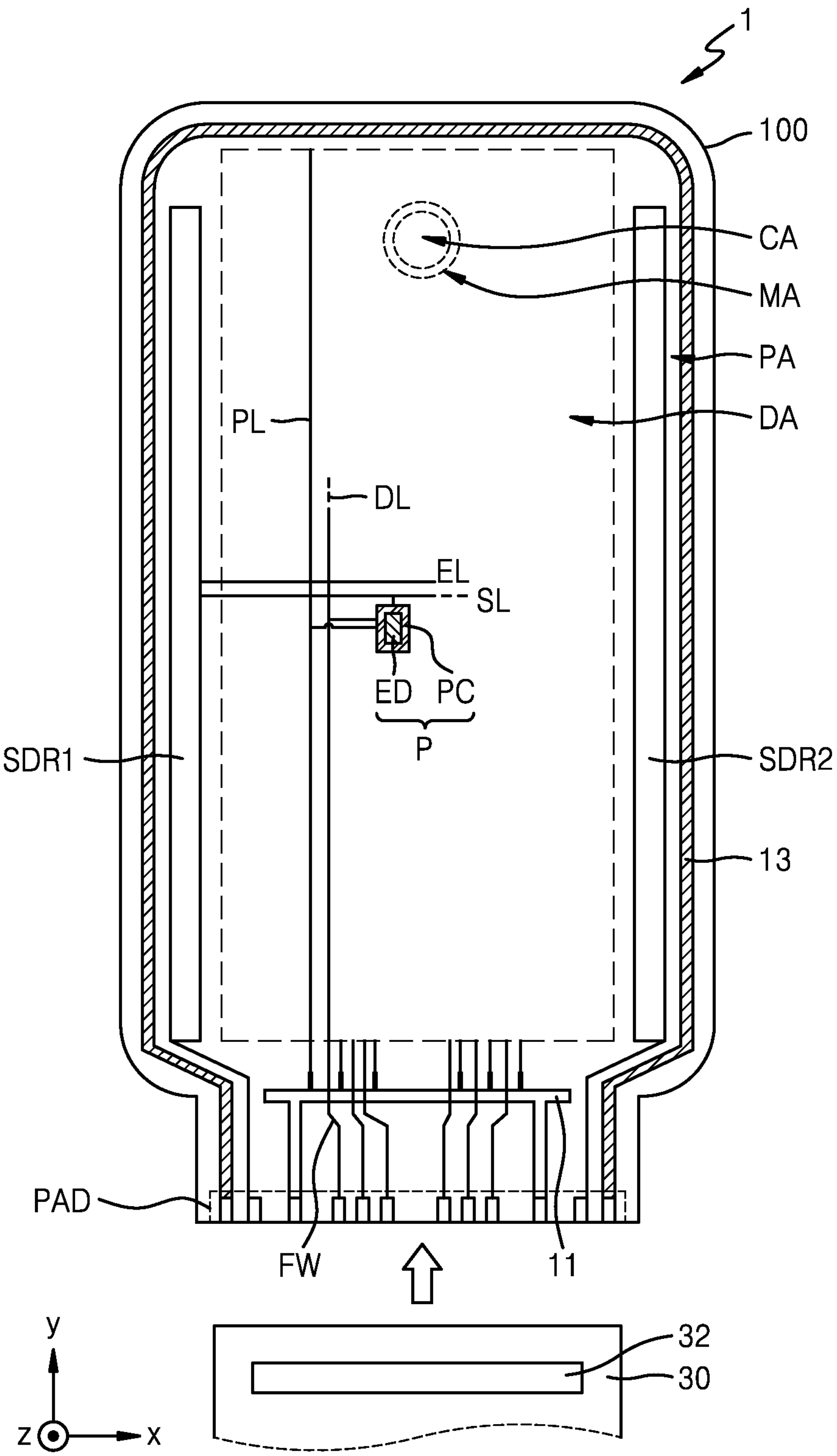
FIG. 3 is a plan view schematically illustrating a display panel that may be included in the display apparatus of FIG. 1.

FIG. 3 is a plan view schematically illustrating the display panel 10 included in the display apparatus 1 of FIG. 1.

A plurality of pixels P are located in the display area DA. Each of the pixels P may include a display element ED such as an organic light-emitting diode OLED. Each of the pixels P includes a pixel circuit PC that controls the display element ED. The pixel circuit PC may overlap the display element ED. Each pixel P may emit, for example, red light, green light, blue light, or white light. The display area DA may be covered by a sealing member to be protected from external air or moisture.

When necessary, the intermediate area MA surrounding the component area CA may be located between the display area DA and the component area CA. In some embodiments, pixels P may be located even in the intermediate area MA. In this case, the number of pixels P per unit area in the intermediate area MA may be less than the number of pixels P per unit area in the display area DA.

The pixel circuits PC included in the pixels P in the display area DA may be respectively electrically connected to outer circuits located in the peripheral area PA. In the peripheral area PA, a first scan driving circuit SDR1, a second scan driving circuit SDR2, a terminal unit PAD, a driving voltage supply line 11, and a common voltage supply line 13 may be located.

The first scan driving circuit SDR1 may be located next to a side of the display area DA (in a −x direction). The second scan driving circuit SDR2 may be symmetrical to the first scan driving circuit SDR1 with respect to the display area DA, in position and shape. The first scan driving circuit SDR1 may be connected to some of the pixel circuits PC through a scan line SL to apply a scan signal. The second scan driving circuit SDR2 may be connected to others of the pixel circuits PC through a scan line (not shown) to apply a scan signal. The first scan driving circuit SDR1 may be connected to some of the pixel circuits PC through an emission control line EL to apply an emission control signal. The second scan driving circuit SDR2 may be connected to others of the pixel circuits PC through an emission control line (not shown) to apply an emission control signal.

The terminal unit PAD may be located on the substrate 100. The terminal unit PAD is not covered by an insulating layer, and is connected to a display circuit board 30. A display driver 32 may be located on the display circuit board 30.

The display driver 32 may generate a control signal transmitted to the first scan driving circuit SDR1 and the second scan driving circuit SDR2. Also, the display driver 32 may generate a data signal, and the generated data signal may be transmitted to the pixel circuit PC through a fan-out wiring FW and a data line DL connected to the fan-out wiring FW.

The display driver 32 may supply a driving voltage ELVDD to the driving voltage supply line 11, and may supply a common voltage ELVSS to the common voltage supply line 13. The driving voltage ELVDD may be applied to the pixel circuit PC through a driving voltage line PL that is connected to the driving voltage supply line 11 and extends substantially in a first direction (y-axis direction) to cross the display area DA. The common voltage ELVSS may be applied to a counter electrode of the display element ED electrically connected to the common voltage supply line 13.

The driving voltage supply line 11 may be located below the display area DA, and may extend in a second direction (x-axis direction) intersecting the first direction (the y-axis direction). A plurality of driving voltage lines PL crossing the display area DA may be located over the display area DA and may be electrically connected to an additional driving voltage supply line (not shown) extending in the second direction (the x-axis direction). The common voltage supply line 13 may loop around three sides of the display area DA and leave the fourth side open.

Figure 4:
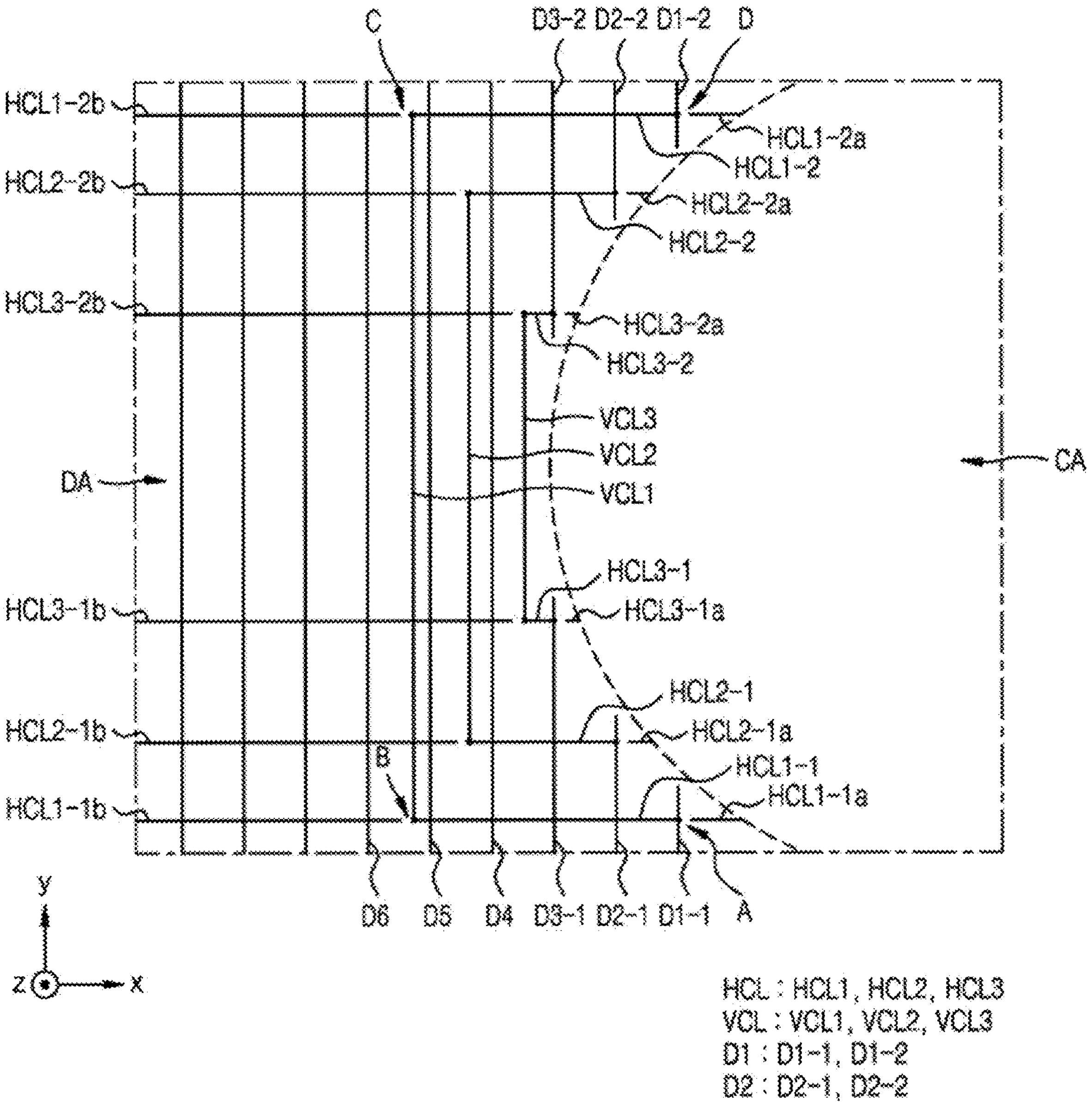
FIG. 4 is a conceptual view schematically illustrating a portion of the display panel of FIG. 3.

FIG. 4 is a conceptual view schematically illustrating a portion of the display panel 10 of FIG. 3. As described above, a plurality of pixels P are located in the display area DA, and each of the pixels P includes the display element ED and the pixel circuit PC that controls the display element ED. Lines through which electrical signals are applied to the pixel circuits PC may be located in the display area DA. Some of horizontal connection lines HCL, some of vertical connection lines VCL, and some of data lines D1, D2, etc. from among the lines are schematically illustrated in FIG. 4. Portions of these lines may be considered as elements of each pixel circuit PC.

A 1-$1^{th}$ data line D1-1 located in the display area DA to be in −y direction from the component area CA extends in the first direction (the y-axis direction) toward the component area CA. The 1-$1^{th}$ data line D1-1 may be electrically connected to a column of pixel circuits arranged in the first direction (the y-axis direction) to be located where the 1-$1^{th}$ data line D1-1 passes, to transmit a data signal to the pixel circuits.

Likewise, a 2-$1^{th}$ data line D2-1 located in the display area DA to be in −y direction from the component area CA extends in the first direction (the y-axis direction) toward the component area CA. The 2-$1^{th}$ data line D2-1 may be electrically connected to a column of pixel circuits arranged in the first direction (the y direction) to be located where the 2-$1^{th}$ data line D2-1 passes, to transmit a data signal to the pixel circuits. This is the same for a 3-$1^{th}$ data line D3-1.

A 1-$2^{th}$ data line D1-2 located in the display area DA to be in +y direction from the component area CA extends in the first direction (the y-axis direction) toward the component area CA. The 1-$2^{th}$ data line D1-2 may be electrically connected to a column of pixel circuits arranged in the first direction (the y-axis direction) to be located where the 1-$2^{th}$ data line D1-2 passes, to transmit a data signal to the pixel circuits. The pixel circuits electrically connected to the 1-$2^{th}$ data line D1-2 and the pixel circuits electrically connected to the 1-1$^{th}$ data line D1-1 may be located in the same column. That is, an extension axis of the 1-2$^{th}$ data line D1-2 in the first direction (the y-axis direction) may match an extension axis of the 1-1$^{th}$ data line D1-1 in the first direction (the y-axis direction).

Likewise, a 2-2$^{th}$ data line D2-2 located in the display area DA to be in +y direction from the component area CA extends in the first direction (the y-axis direction) toward the component area CA. The 2-2$^{th}$ data line D2-2 may be electrically connected to a column of pixel circuits arranged in the first direction (the y-axis direction) to be located where the 2-2$^{th}$ data line D2-2 passes, to transmit a data signal to the pixel circuits. The pixel circuits electrically connected to the 2-2$^{th}$ data line D2-2 and the pixel circuits electrically connected to the 2-1$^{th}$ data line D2-1 may be located in the same column. That is, an extension axis of the 2-2$^{th}$ data line D2-2 in the first direction (the y-axis direction) may match an extension axis of the 2-1$^{th}$ data line D2-1 in the first direction (the y-axis direction). This is the same for a 3-2$^{th}$ data line D3-2 and a 3-1$^{th}$ data line D3-1.

The 1-1$^{th}$ data line D1-1 and the 1-2$^{th}$ data line D1-2 may be electrically connected to each other. In detail, the 1-1$^{th}$ data line D1-1 and the 1-2$^{th}$ data line D1-2 may be electrically connected to each other through a 1-1$^{th}$ horizontal connection line HCL1-1, a first vertical connection line VCL1, and a 1-2$^{th}$ horizontal connection line HCL1-2.

The 1-1$^{th}$ horizontal connection line HCL1-1 is located in the display area DA to be located in the −y direction with respect to the center of the component area CA, and extends in the second direction (the x-axis direction) to cross the display area DA and extend toward the component area CA. A portion of the 1-1$^{th}$ horizontal connection line HCL1-1 close to the component area CA may be electrically connected to the 1-1$^{th}$ data line D1-1 in a portion A in FIG. 4. The first vertical connection line VCL1 may be electrically connected to a portion of the 1-1$^{th}$ horizontal connection line HCL1-1 away from the component area CA in a portion B in FIG. 4, and may extend in the first direction (the y-axis direction). The 1-2$^{th}$ horizontal connection line HCL1-2 is located in the display area DA to be located in the +y direction with respect to the center of the component area CA, and extends in the second direction (the x-axis direction) intersecting the first direction. A portion of the 1-2$^{th}$ horizontal connection line HCL1-2 away from the component area CA may be electrically connected to the first vertical connection line VCL1 in a portion C in FIG. 4. A portion of the 1-2$^{th}$ horizontal connection line HCL1-2 close to the component area CA may be electrically connected to the 1-2$^{th}$ data line D1-2 in a portion D in FIG. 4.

As such, the display apparatus according to the present embodiment may transmit a data signal to pixels belonging to the same column extending in the first direction (the y-axis direction) and electrically connected to the 1-1$^{th}$ data line D1-1 and the 1-2$^{th}$ data line D1-2, through the 1-1$^{th}$ data line D1-1 and the 1-2$^{th}$ data line D1-2 that are electrically connected to each other.

The 2-1$^{th}$ data line D2-1 and the 2-2$^{th}$ data line D2-2 may also be electrically connected to each other. In detail, the 2-1$^{th}$ data line D2-1 and the 2-2$^{th}$ data line D2-2 may be electrically connected to each other through a 2-1$^{th}$ horizontal connection line HCL2-1, a second vertical connection line VCL2, and a 2-2$^{th}$ horizontal connection line HCL2-2.

The 2-1$^{th}$ horizontal connection line HCL2-1 is located in the display area DA to be located in the −y direction with respect to the center of the component area CA, and extends in the second direction (the x-axis direction) intersecting the first direction. A portion of the 2-1$^{th}$ horizontal connection line HCL2-1 close to the component area CA may be electrically connected to the 2-1$^{th}$ data line D2-1. The second vertical connection line VCL2 may be electrically connected to a portion of the 2-1$^{th}$ horizontal connection line HCL2-1 away from the component area CA, and may extend in the first direction (the y-axis direction). The 2-2$^{th}$ horizontal connection line HCL2-2 is located in the display area DA to be located in the +y direction with respect to the center of the component area CA, and extends in the second direction (the x-axis direction) intersecting the first direction. A portion of the 2-2$^{th}$ horizontal connection line HCL2-2 away from the component area CA may be electrically connected to the second vertical connection line VCL2. A portion of the 2-2$^{th}$ horizontal connection line HCL2-2 close to the component area CA may be electrically connected to the 2-2$^{th}$ data line D2-2.

As such, the display apparatus according to the present embodiment may transmit a data signal to pixels belonging to the same column extending in the first direction (the y-axis direction) and electrically connected to the 2-1$^{th}$ data line D2-1 and the 2-2$^{th}$ data line D2-2, through the 2-1$^{th}$ data line D2-1 and the 2-2$^{th}$ data line D2-2 that are electrically connected to each other.

In the same manner, the 3-1$^{th}$ data line D3-1 and the 3-2$^{th}$ data line D3-2 may be electrically connected to each other. In detail, the 3-1$^{th}$ data line D3-1 and the 3-2$^{th}$ data line D3-2 may be electrically connected to each other through a 3-1$^{th}$ horizontal connection line HCL3-1, a third vertical connection line VCL3, and a 3-2$^{th}$ horizontal connection line HCL3-2.

For reference, the 1-1$^{th}$ data line D1-1, the 2-1$^{th}$ data line D2-1, and the 3-1$^{th}$ data line D3-1 may be sequentially arranged from the center of the component area CA in the −x direction. Accordingly, the third vertical connection line VCL3, the second vertical connection line VCL2, and the first vertical connection line VCL1 may be sequentially arranged to be farther from the center of the component area CA in the −x direction as shown in FIG. 4.

As shown in FIG. 4, a fourth data line D4, a fifth data line D5, and a sixth data line D6 may be arranged from the 3-1$^{th}$ data line D3-1 in the −x direction. Each of the fourth data line D4, the fifth data line D5, and the sixth data line D6 extends in the first direction (the y-axis direction), but is not disconnected by the component area CA.

A 1-1$^{th}$ auxiliary horizontal connection line HCL1-1*a* extending in the second direction (the x-axis direction) may be located between the 1-1$^{th}$ horizontal connection line HCL1-1 and the component area CA. The 1-1$^{th}$ auxiliary horizontal connection line HCL1-1*a* may be spaced apart from the 1-1$^{th}$ horizontal connection line HCL1-1. In addition, a 1-1$^{th}$ additional horizontal connection line HCL1-1*b* extending in the second direction (the x-axis direction) may be located between the 1-1$^{th}$ horizontal connection line HCL1-1 and the peripheral area PA. The 1-1$^{th}$ additional horizontal connection line HCL1-1*b* may also be spaced apart from the 1-1$^{th}$ horizontal connection line HCL1-1. The 1-1$^{th}$ auxiliary horizontal connection line HCL1-1*a* and the 1-1$^{th}$ additional horizontal connection line HCL1-1*b* may be located in the same row as the 1-1$^{th}$ horizontal connection line HCL1-1.

As described above, the 1-1$^{th}$ horizontal connection line HCL1-1 extending in the second direction (the x-axis direction) electrically connects the 1-1$^{th}$ data line D1-1 to the 1-2$^{th}$ data line D1-2. However, it is preferable that most pixels located in a row through which the 1-1$^{th}$ horizontal connection line HCL1-1 passes have the same or similar structure in order to implement a display apparatus for displaying a high-quality image. Accordingly, unlike the 1-1$^{th}$ horizontal connection line HCL1-1 electrically connected to the 1-1$^{th}$ data line D1-1, the 1-1$^{th}$ auxiliary horizontal connection line HCL1-1*a* and the 1-1$^{th}$ additional horizontal connection line HCL1-1*b*, which are not connected to a data line, may be spaced apart from the 1-1$^{th}$ horizontal connection line HCL1-1 and located in the same row as the 1-1$^{th}$ horizontal connection line HCL1-1. Accordingly, because most of pixels located in a row through which the 1-1$^{th}$ horizontal connection line HCL1-1 passes have the same or similar structure, a display apparatus for displaying a high-quality image may be implemented.

This is the same for other horizontal connection lines. For example, a 2-1$^{th}$ auxiliary horizontal connection line HCL2-1*a* that is spaced apart from the 2-1$^{th}$ horizontal connection line HCL2-1 and extending in the second direction (the x-axis direction) may be located between the 2-1$^{th}$ horizontal connection line HCL2-1 and the component area CA. In addition, a 2-1$^{th}$ additional horizontal connection line HCL2-1*b*$^{th}$ at is spaced apart from the 2-1$^{th}$ horizontal connection line HCL2-1 and extending in the second direction (the x-axis direction) may be located between the 2-1$^{th}$ horizontal connection line HCL2-1 and the peripheral area PA. The 2-1$^{th}$ auxiliary horizontal connection line HCL2-1*a* and the 2-1$^{th}$ additional horizontal connection line HCL2-1*b* may be located in the same row as the 2-1$^{th}$ horizontal connection line HCL2-1.

As such, to have a relationship similar to that between the 1-1$^{th}$ horizontal connection line HCL1-1, the 1-1$^{th}$ auxiliary horizontal connection line HCL1-1*a*, and the 1-1$^{th}$ additional horizontal connection line HCL1-1*b*, the 3-1$^{th}$ horizontal connection line HCL3-1, a 3-1$^{th}$ auxiliary horizontal connection line HCL3-1*a*, and a 3-1$^{th}$ additional horizontal connection line HCL3-1*b* may exist, the 3-2$^{th}$ horizontal connection line HCL3-2, a 3-2$^{th}$ auxiliary horizontal connection line HCL3-2*a*, and a 3-2$^{th}$ additional horizontal connection line HCL3-2*b* may exist, the 2-2$^{th}$ horizontal connection line HCL2-2, a 2-2$^{th}$ auxiliary horizontal connection line HCL2-2*a*, and a 2-2$^{th}$ additional horizontal connection line HCL2-2*b* may exist, and the 1-2$^{th}$ horizontal connection line HCL1-2, a 1-2$^{th}$ auxiliary horizontal connection line HCL1-2*a*, and a 1-2$^{th}$ additional horizontal connection line HCL1-2*b* may exist, as shown in FIG. 4.

This may be the same for vertical connection lines. Although not shown in FIG. 4, for example, a first auxiliary vertical connection line and a first additional vertical connection line extending in the first direction (e.g., the y-axis direction) and spaced apart from the first vertical connection line VCL1 may be located in the same column as the first vertical connection line VCL1. The first auxiliary vertical connection line may be located in the +y direction from the first vertical connection line VCL1, and the first additional vertical connection line may be located in the −y direction from the first vertical connection line VCL1.

Figure 5:
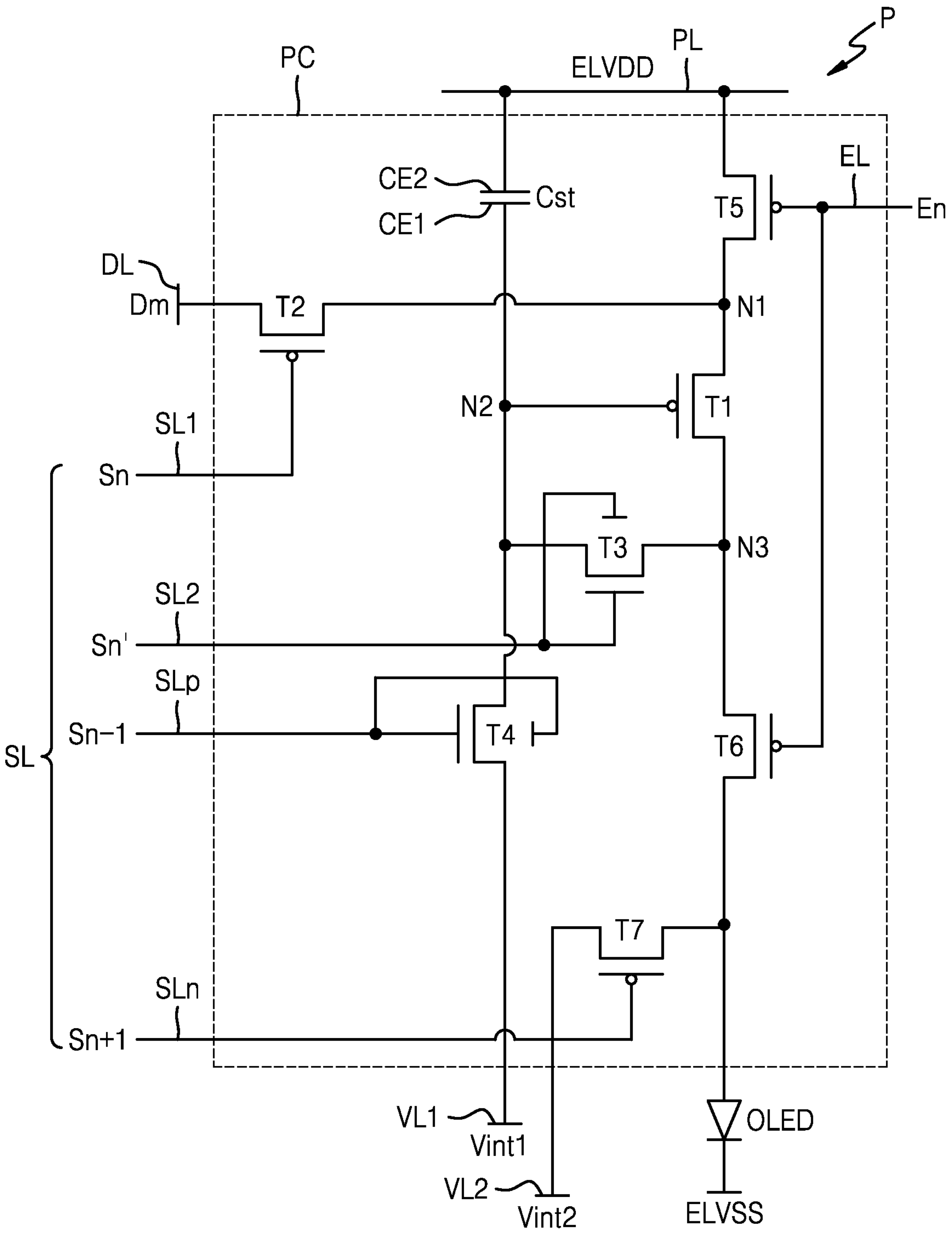
FIG. 5 is an equivalent circuit diagram illustrating a pixel included in the display apparatus of FIG. 1.

FIG. 5 is an equivalent circuit diagram illustrating one pixel P included in the display apparatus of FIG. 1. As shown in FIG. 5, one pixel P may include a pixel circuit PC and an organic light-emitting diode OLED electrically connected to the pixel circuit PC.

The pixel circuit PC may include a plurality of thin-film transistors (e.g., T1 through T7) and a storage capacitor Cst as shown in FIG. 5. The plurality of thin-film transistors (e.g., T1 through T7) and the storage capacitor Cst may be connected to signal lines (e.g., SL1, SL2, SLp, SLn, EL, and DL), a first initialization voltage line VL1, a second initialization voltage line VL2, and the driving voltage line PL. At least one of the lines (wirings), for example, the driving voltage line PL, may be shared by neighboring pixels P.

The plurality of thin-film transistors (e.g., T1 through T7) may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode and a counter electrode. The pixel electrode of the organic light-emitting diode OLED may be connected to the driving transistor T1 via the emission control transistor T6 to receive driving current, and the counter electrode may receive a common voltage ELVSS. The organic light-emitting diode OLED may generate light having a luminance corresponding to the driving current.

Some of the plurality of thin-film transistors (e.g., T1 through T7) may be n-channel MOSFETs (NMOSs) and the rest may be p-channel MOSFETs (PMOSs). For example, the compensation transistor T3 and the first initialization transistor T4 from among the plurality of thin-film transistors (e.g., T1 through T7) may be NMOSs and the rest may be PMOSs. Alternatively, the compensation transistor T3, the first initialization transistor T4, and the second initialization transistor T7 from among the plurality of thin-film transistors (e.g., T1 through T7) may be NMOSs and the rest may be PMOSs. Alternatively, all of the plurality of thin-film transistors (e.g., T1 through T7) may be NMOSs or PMOSs. The plurality of thin-film transistors (e.g., T1 through T7) may include amorphous silicon or polysilicon. When necessary, a thin-film transistor that is an NMOS may include an oxide semiconductor. For convenience, the following will be described assuming that the compensation transistor T3 and the first initialization transistor T4 are NMOSs including an oxide semiconductor and the rest are PMOSs.

The signal lines may include a first scanline SL1 configured to transmit a first scan signal Sn, a second scan line SL2 configured to transmit a second scan signal Sn', a previous scan line SLp configured to transmit a previous scan signal Sn−1 to the first initialization transistor T4, a next scan line SLn configured to transmit a next scan signal Sn+1 to the second initialization transistor T7, the emission control line EL configured to transmit an emission control signal En to the operation control transistor T5 and the emission control transistor T6, and the data line DL crossing the first scan line SL1 and configured to transmit a data signal Dm. The data line DL may be any one of the 1-1$^{th}$ data line D1-1, the 1-2$^{th}$ data line D1-2, the 2-1$^{th}$ data line D2-1, the 2-2$^{th}$ data line D2-2, the 3-1$^{th}$ data line D3-1, the 3-2$^{th}$ data line D3-2, the fourth data line D4, the fifth data line D5, and the sixth data line D6 described with reference to FIG. 4.

The driving voltage line PL may transmit the driving voltage ELVDD to the driving transistor T1, the first initialization voltage line VL1 may transmit a first initialization voltage Vint1 for initializing the driving transistor T1, and the second initialization voltage line VL2 may transmit a second initialization voltage Vint2 for initializing a first electrode (the pixel electrode) of the organic light-emitting diode OLED.

A driving gate electrode of the driving transistor T1 may be connected to the storage capacitor Cst through a second node N2, any one of a source region and a drain region of the driving transistor T1 may be connected to the driving voltage line PL via the operation control transistor T5 through a first node N1, and the other of the source region and the drain region of the driving transistor T1 may be electrically connected to the first electrode (pixel electrode) of the organic light-emitting diode OLED via the emission control transistor T6 through a third node N3. The driving transistor T1 may receive the data signal Dm according to a switching operation of the switching transistor T2 and may supply driving current to the organic light-emitting diode OLED. That is, the driving transistor T1 may control the amount of current flowing from the first node N1 electrically connected to the driving voltage line PL to the organic light-emitting diode OLED, in response to a voltage applied to the second node N2 which varies according to the data signal Dm.

A switching gate electrode of the switching transistor T2 may be connected to the first scan line SL1 that transmits the first scan signal Sn, any one of a source region and a drain region of the switching transistor T2 may be connected to the data line DL, and the other of the source region and the drain region of the switching transistor T2 may be connected to the driving transistor T1 through the first node N1 and may be connected to the driving voltage line PL via the operation control transistor T5. The switching transistor T2 may transmit the data signal Dm from the data line DL to the first node N1, in response to a voltage applied to the first scan line SL1. The switching transistor T2 may be turned on according to the first scan signal Sn received through the first scan line SL1, and may perform a switching operation of transmitting the data signal Dm transmitted through the data line DL to the driving transistor T1 through the first node N1.

A compensation gate electrode of the compensation transistor T3 may be connected to the second scan line SL2. Any one of a source region and a drain region of the compensation transistor T3 may be connected to the first electrode (the pixel electrode) of the organic light-emitting diode OLED via the emission control transistor T6 through the third node N3. The other of the source region and the drain region of the compensation transistor T3 may be connected to a first capacitor electrode CE1 of the storage capacitor Cst and the driving gate electrode of the driving transistor T1 through the second node N2. The compensation transistor T3 may be turned on according to the second scan signal Sn' received through the second scan line SL2 and may diode-connect the driving transistor T1.

A first initialization gate electrode of the first initialization transistor T4 may be connected to the previous scan line SLp. Any one of a source region and a drain region of the first initialization transistor T4 may be connected to the first initialization voltage line VL1. The other of the source region and the drain region of the first initialization transistor T4 may be connected to a first capacitor electrode CE1 of the storage capacitor Cst and the driving gate electrode of the driving transistor T1 through the second node N2. The first initialization transistor T4 may apply the first initialization voltage Vint1 from the first initialization voltage line VL1 to the second node N2, in response to a voltage applied to the previous scan line SLp. That is, the first initialization transistor T4 may be turned on according to the previous scan signal Sn−1 received through the previous scan line SLp and may perform an initialization operation of initializing a voltage of the driving gate electrode of the driving transistor T1 by transmitting the first initialization voltage Vint1 to the driving gate electrode of the driving transistor T1.

An operation control gate electrode of the operation control transistor T5 may be connected to the emission control line EL, any one of a source region and a drain region of the operation control transistor T5 may be connected to the driving voltage line PL, and the other of the source region and the drain region of the operation control transistor T5 may be connected to the driving transistor T1 and the switching transistor T2 through the first node N1.

An emission control gate electrode of the emission control transistor T6 may be connected to the emission control line EL, any one of a source region and a drain region of the emission control transistor T6 may be connected to the driving transistor T1 and the compensation transistor T3 through the third node N3, and the other of the source region and the drain region of the emission control transistor T6 may be electrically connected to the first electrode (pixel electrode) of the organic light-emitting diode OLED.

The operation control transistor T5 and the emission control transistor T6 may be simultaneously turned on according to the emission control signal En received through the emission control line EL, so that the driving voltage ELVDD is transmitted to the organic light-emitting diode OLED and the driving current flows through the organic light-emitting diode OLED.

A second initialization gate electrode of the second initialization transistor T7 may be connected to the next scan line SLn, any one of a source region and a drain region of the second initialization transistor T7 may be connected to the first electrode (pixel electrode) of the organic light-emitting diode OLED, and the other of the source region and the drain region of the second initialization transistor T7 may be connected to the second initialization voltage line VL2 and may receive the second initialization voltage Vint2. The second initialization transistor T7 is turned on according to the next scan signal Sn+1 received through the next scan line SLn, and initializes the first electrode (pixel electrode) of the organic light-emitting diode OLED. The next scan line SLn may be the same as the first scan line SL1. In this case, the scan line may function as the first scan line SL1 or may function as the next scan line SLn, by transmitting the same electrical signal with a time difference. That is, the next scan line SLn may be a first scan line of a pixel that is adjacent to the pixel P of FIG. 3 and is electrically connected to the data line DL.

The second initialization transistor T7 may be connected to the next scan line SLn as shown in FIG. 5. However, the disclosure is not limited thereto, and the second initialization transistor T7 may be connected to the emission control line EL and may operate according to the emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store a charge corresponding to a difference between a driving gate electrode voltage of the driving transistor T1 and the driving voltage ELVDD.

A specific operation of each pixel P according to an embodiment is as follows.

During an initialization period, when the previous scan signal Sn−1 is applied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and the second scan signal Sn' are supplied through the first scan line SL1 and the second scan line SL2, the switching transistor T2 and the compensation transistor T3 are turned on in response to the first scan signal Sn and the second scan signal Sn'. In this case, the driving transistor T1 is diode-connected by the turned-on compensation transistor T3, and is forward biased. Next, a compensation voltage Dm+Vth (Vth is a negative (−) value) obtained by subtracting a threshold voltage Vth of the driving transistor T1 from the data signal Dm supplied from the data line DL is applied to the driving gate electrode of the driving transistor T1. The driving voltage ELVDD and the compensation voltage Dm+Vth are applied to both ends of the storage capacitor Cst, and a charge corresponding to a voltage difference between both ends is stored in the storage capacitor Cst.

During a light emission period, the operation control transistor T5 and the emission control transistor T6 are turned on by the emission control signal En supplied from the emission control line EL. Driving current according to a voltage difference between a voltage of the driving gate electrode of the driving transistor T1 and the driving voltage ELVDD is generated, and the driving current is supplied to the organic light-emitting diode OLED through the emission control transistor T6.

As described above, some of the plurality of thin-film transistors (e.g., T1 through T7) may include an oxide semiconductor. For example, the compensation transistor T3 and the first initialization transistor T4 may include an oxide semiconductor.

Because polysilicon has high reliability, intended current may be controlled to flow accurately. Accordingly, the driving transistor T1 which directly affects a luminance of a display apparatus may include a semiconductor layer including polysilicon having high reliability, and thus, a high-resolution display apparatus may be realized. Because an oxide semiconductor has high carrier mobility and low leakage current, voltage drop is not large even when a driving time is long. That is, in the case of an oxide semiconductor, because a color change in an image due to voltage drop is not large even during low-frequency driving, low-frequency driving is possible. Accordingly, the compensation transistor T3 and the first initialization transistor T4 may include an oxide semiconductor, and thus, leakage current may be prevented and the display apparatus with reduced power consumption may be realized.

Because an oxide semiconductor is sensitive to light, the amount of current may be changed by external light. External light may be absorbed or reflected by locating a metal layer under the oxide semiconductor. Accordingly, as shown in FIG. 5, in each of the compensation transistor T3 and the first initialization transistor T4 including an oxide semiconductor, gate electrodes may be located over and under an oxide semiconductor layer. That is, when viewed in a direction (a z-axis direction) perpendicular to a top surface of the substrate 100, a metal layer located under an oxide semiconductor may overlap the oxide semiconductor.

Figure 6:
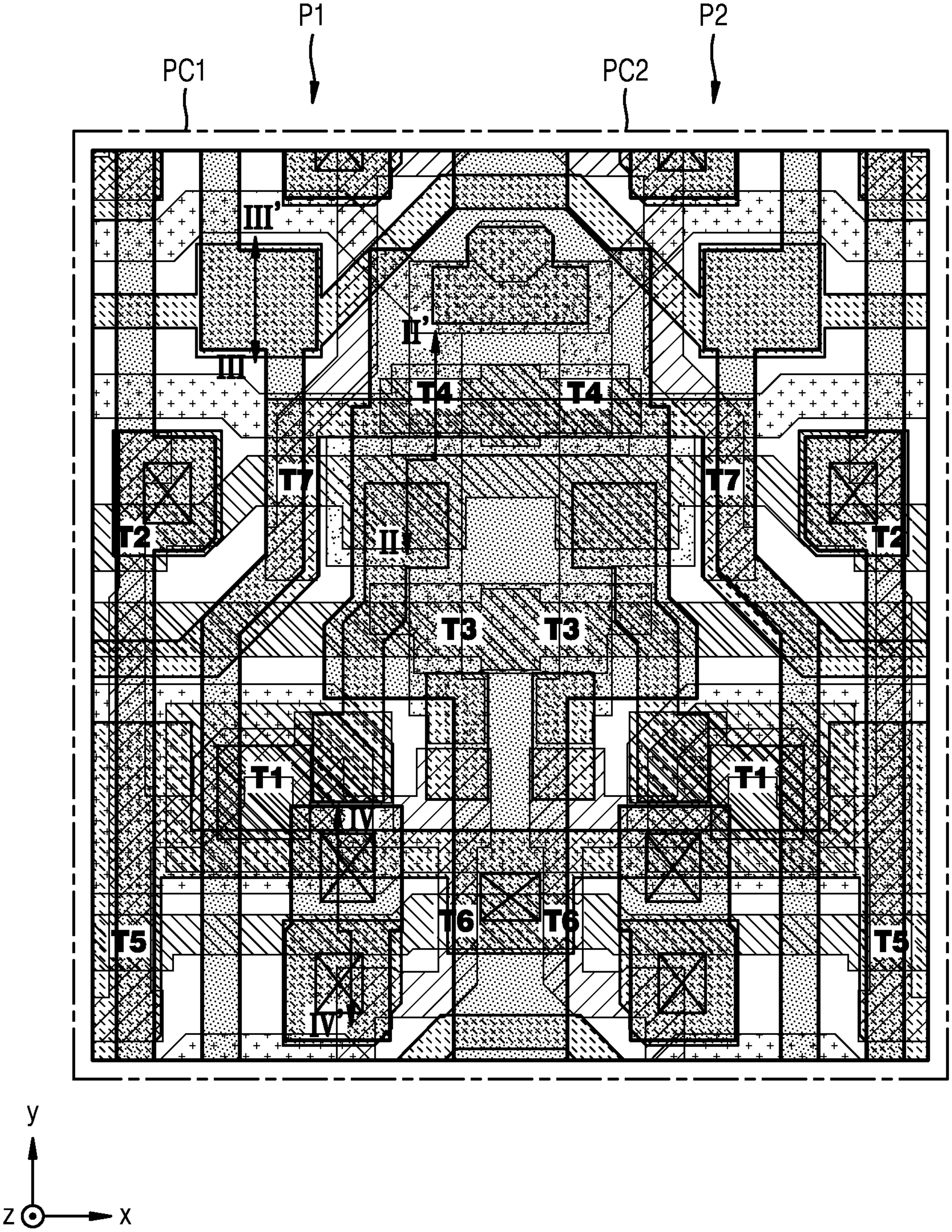
FIG. 6 is a layout view schematically illustrating positions of transistors and capacitors in pixels included in the display apparatus of FIG. 1.

FIG. 6 is a layout view schematically illustrating positions of transistors and capacitors in pixels included in the display apparatus of FIG. 1. FIGS. 7 to 13 are layout views schematically illustrating elements such as transistors and capacitors of the display apparatus of FIG. 6 according to layers. FIG. 14 is a schematic cross-sectional view taken along lines II-II', III-III', and IV-IV' of the display apparatus of FIG. 6.

As shown in the drawings, the display apparatus may include a first pixel P1 and a second pixel P2 that are adjacent to each other. The first pixel P1 and the second pixel P2 may be symmetrical to each other with respect to a virtual line (not shown) as depicted in FIG. 6. In some embodiments, the first pixel P1 and the second pixel P2 may have the same structure rather than a symmetrical structure. The first pixel P1 may include a first pixel circuit PC1, and the second pixel P2 may include a second pixel circuit PC2. Although some conductive patterns are described based on the first pixel circuit PC1 for convenience of explanation, the conductive patterns may also be symmetrically located even in the second pixel circuit PC2.

A buffer layer 111 (see FIG. 14) including silicon oxide, silicon nitride, or silicon oxynitride may be located on the substrate 100. The buffer layer 111 may prevent metal atoms or impurities from being diffused from the substrate 100 into a first semiconductor layer 1100. Also, the buffer layer 111 may uniformly crystalize the first semiconductor layer 1100 by adjusting a heat supply rate during a crystallization process for forming the first semiconductor layer 1100.

Figure 7:
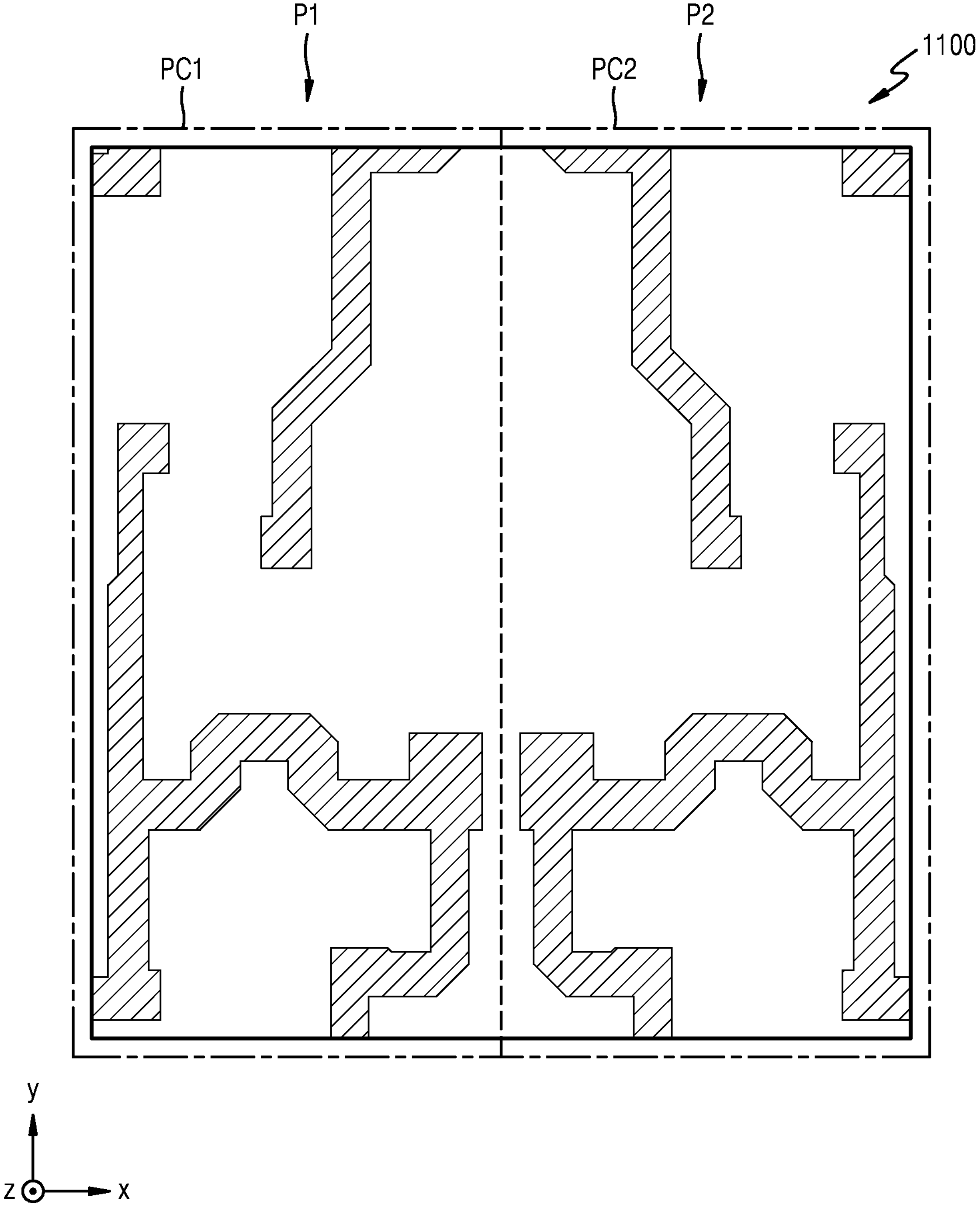
FIGS. 7 to 13 are layout views schematically illustrating elements such as transistors and capacitors of the display apparatus of FIG. 6 according to layers.

The first semiconductor layer 1100 as shown in FIG. 7 may be located on the buffer layer 111. The first semiconductor layer 1100 may include a silicon semiconductor. For example, the first semiconductor layer 1100 may include amorphous silicon or polysilicon. In detail, the first semiconductor layer 1100 may include polysilicon crystalized at a low temperature. When necessary, ions may be implanted into at least a portion of the first semiconductor layer 1100.

Because the driving transistor T1, the switching transistor T2, the operation control transistor T5, the emission control transistor T6, and the second initialization transistor T7 may be PMOSs as described above, in this case, the thin-film transistors are located along the first semiconductor layer 1100 as shown in FIG. 7.

A first gate insulating layer 113 (see FIG. 14) may cover the first semiconductor layer 1100 and may be located on the substrate 100. The first gate insulating layer 113 may include an insulating material. For example, the first gate insulating layer 113 may include silicon oxide, silicon nitride, silicon oxynitride, or aluminum oxide.

Figure 8:
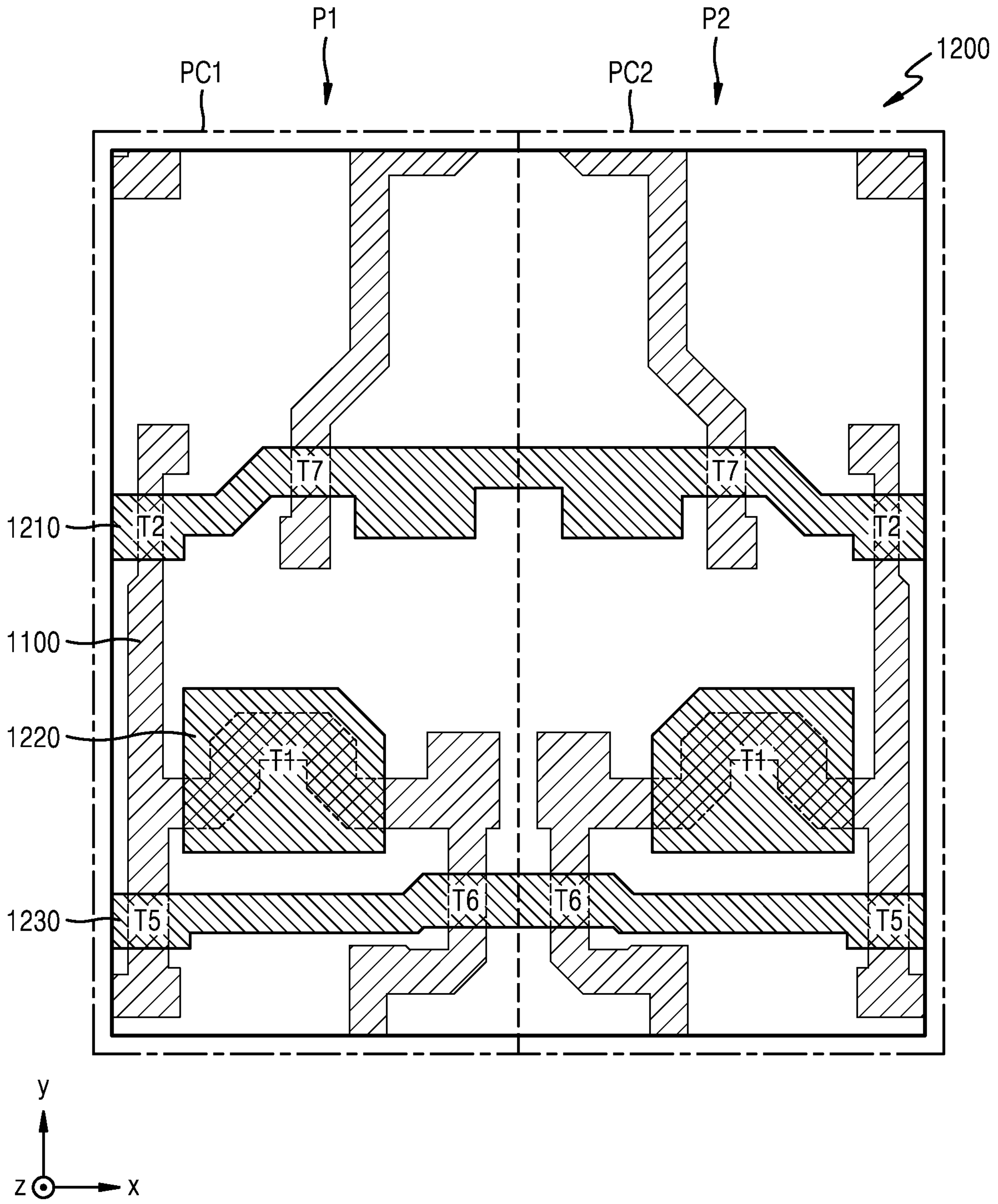

A first gate layer 1200 as shown in FIG. 8 may be located on the first gate insulating layer 113. For convenience of explanation, in FIG. 8, the first gate layer 1200 is illustrated together with the first semiconductor layer 1100. The first gate layer 1200 may include a first gate line 1210, a first gate electrode 1220, and a second gate line 1230.

The first gate line 1210 may extend in the second direction (the x-axis direction). The first gate line 1210 may be the first scan line SL1 or the next scan line SLn of FIG. 5. That is, for the first pixel P1 as shown in FIG. 8, the first gate line 1210 may correspond to the first scan line SL1 of FIG. 5, and for a pixel adjacent to the first pixel P1 (in the +y direction), the first gate line 1210 may correspond to the next scan line SLn of FIG. 5. Accordingly, the first scan signal Sn and the next scan signal Sn+1 may be applied to pixels through the first gate line 1210. Portions of the first gate line 1210 overlapping the first semiconductor layer 1100 may be the switching gate electrode of the switching transistor T2 and the second initialization gate electrode of the second initialization transistor T7.

The first gate electrode 1220 may have an isolated shape. The first gate electrode 1220 is the driving gate electrode of the driving transistor T1. For reference, a portion of the first semiconductor layer 1100 overlapping the first gate electrode 1220 may be referred to as a driving semiconductor layer.

The second gate line 1230 may extend in the second direction (the x-axis direction). The second gate line 1230 may correspond to the emission control line EL of FIG. 5. Portions of the second gate line 1230 overlapping the first semiconductor layer 1100 may be the operation control gate electrode of the operation control transistor T5 and the emission control gate electrode of the emission control transistor T6. The emission control signal En may be applied to pixels through the second gate line 1230.

The first gate layer 1200 may include a metal, an alloy, a conductive metal oxide, or a transparent conductive material. For example, the first gate layer 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first gate layer 1200 may have a multi-layer structure. For example, the first gate layer 1200 may have a two-layer structure including Mo/Al or a three-layer structure including Mo/Al/Mo.

A second gate insulating layer 115 (see FIG. 14) may cover the first gate layer 1200, and may be located on the first gate insulating layer 113. The second gate insulating layer 115 may include the same/similar insulating material as/to the first gate insulating layer 113.

A second gate layer 1300 may be located on the second gate insulating layer 115. The second gate layer 1300 may include a third gate line 1310, a fourth gate line 1320, a capacitor upper electrode 1330, and a first initialization voltage line 1340 (i.e., the first initialization voltage line VL1 of FIG. 5).

The third gate line 1310 may extend in the second direction (the x-axis direction). The third gate line 1310 may correspond to the previous scan line SLp of FIG. 5. When viewed in the direction (the z-axis direction) perpendicular to the substrate 100, the third gate line 1310 may be spaced apart from the first gate line 1210. The previous scan signal Sn−1 may be applied to pixels through the third gate line 1310. A portion of the third gate line 1310 overlapping a second semiconductor layer 1400 described below may be the first initialization lower gate electrode of the first initialization transistor T4.

Figure 9:
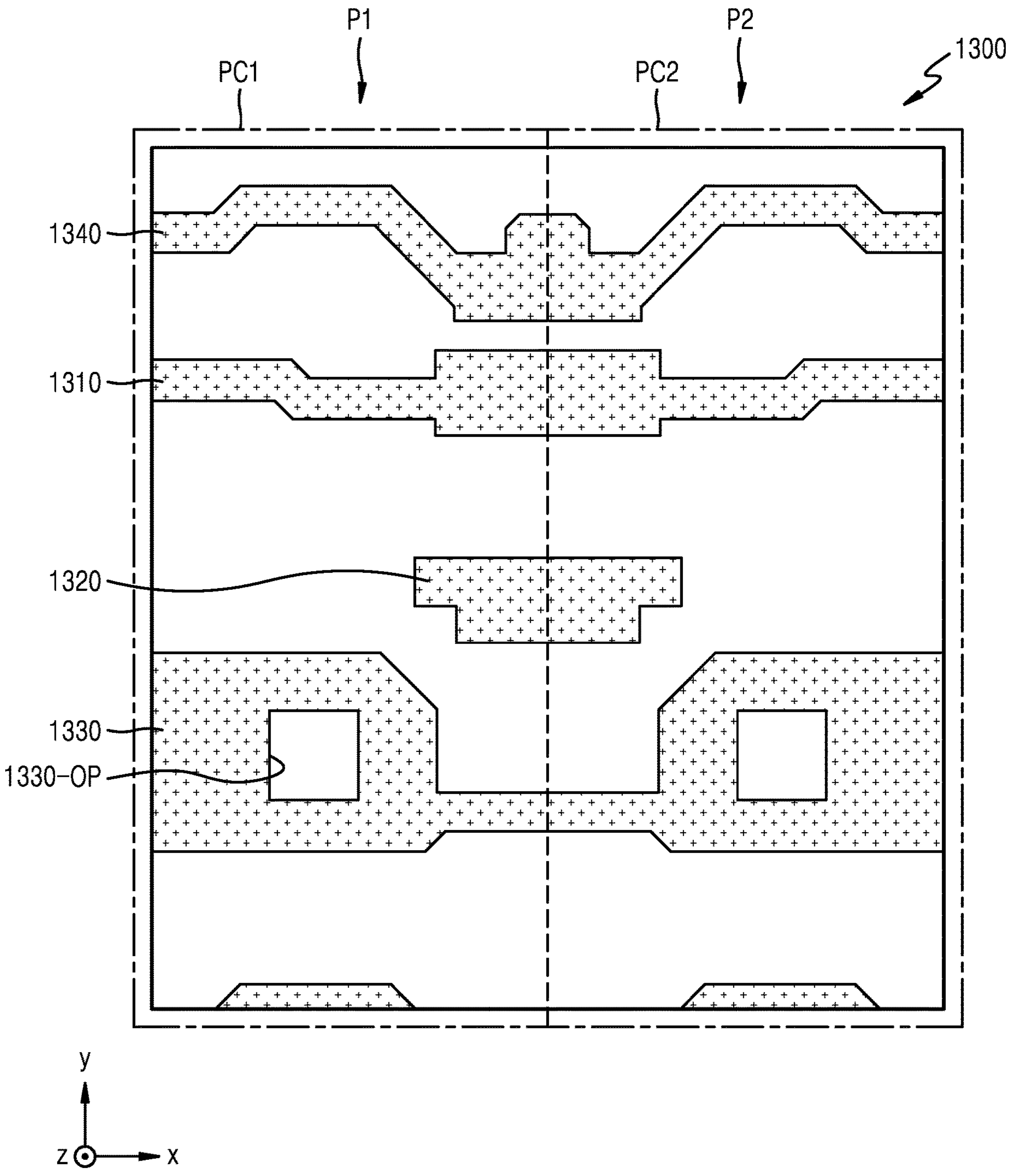

The fourth gate line 1320 may extend in the second direction (the x-axis direction), and may have an isolated shape as shown in FIG. 9 when necessary. The fourth gate line 1320 may be electrically connected to a sixth gate line 1530 described below, and may correspond to the second scan line SL2 of FIG. 5. When viewed in the direction (the z-axis direction) perpendicular to the substrate 100, the fourth gate line 1320 may be spaced apart from the first gate line 1210 and the third gate line 1310. The second scan signal Sn' may be applied to pixels through the fourth gate line 1320. A portion of the fourth gate line 1320 overlapping the second semiconductor layer 1400 described below may be a compensation lower gate electrode of the compensation transistor T3.

The third gate line 1310 and the fourth gate line 1320 may be located under the second semiconductor layer 1400 described below with reference to FIG. 10, and may function as gate electrodes and may function as a lower protective metal for protecting portions of the second semiconductor layer 1400 overlapping the third gate line 1310 and the fourth gate line 1320.

The capacitor upper electrode 1330 may overlap the first gate electrode 1220, and may extend in the second direction (the x-axis direction). The capacitor upper electrode 1330 may correspond to the second capacitor electrode CE2 of FIG. 5, and may constitute the storage capacitor Cst together with the first gate electrode 1220. The driving voltage ELVDD may be applied to the capacitor upper electrode 1330. Also, a hole passing through the capacitor upper electrode 1330 may be formed in the capacitor upper electrode 1330, and at least a portion of the first gate electrode 1220 may overlap the hole.

The first initialization voltage line 1340 corresponding to the first initialization voltage line VL1 of FIG. 5 may extend substantially in the second direction (the x-axis direction). When viewed in the direction (the z-axis direction) perpendicular to the substrate 100, the first initialization voltage line 1340 may be spaced apart from the third gate line 1310. The first initialization voltage Vint1 may be applied to pixels through the first initialization voltage line 1340. The first initialization voltage line 1340 may at least partially overlap the second semiconductor layer 1400 described below, and may transmit the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3 described below with reference to FIG. 12.

The second gate layer 1300 may include a metal, an alloy, a conductive metal oxide, or a transparent conductive material. For example, the second gate layer 1300 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second gate layer 1300 may have a multi-layer structure. For example, the second gate layer 1300 may have a two-layer structure including Mo/Al or may have a three-layer structure including Mo/Al/Mo.

A first interlayer insulating layer 117 (see FIG. 14) may cover the second gate layer 1300, and may be located on the second gate insulating layer 115. The first interlayer insulating layer 117 may include an insulating material. For example, the first interlayer insulating layer 117 may include silicon oxide, silicon nitride, silicon oxynitride, or aluminum oxide.

Figure 10:
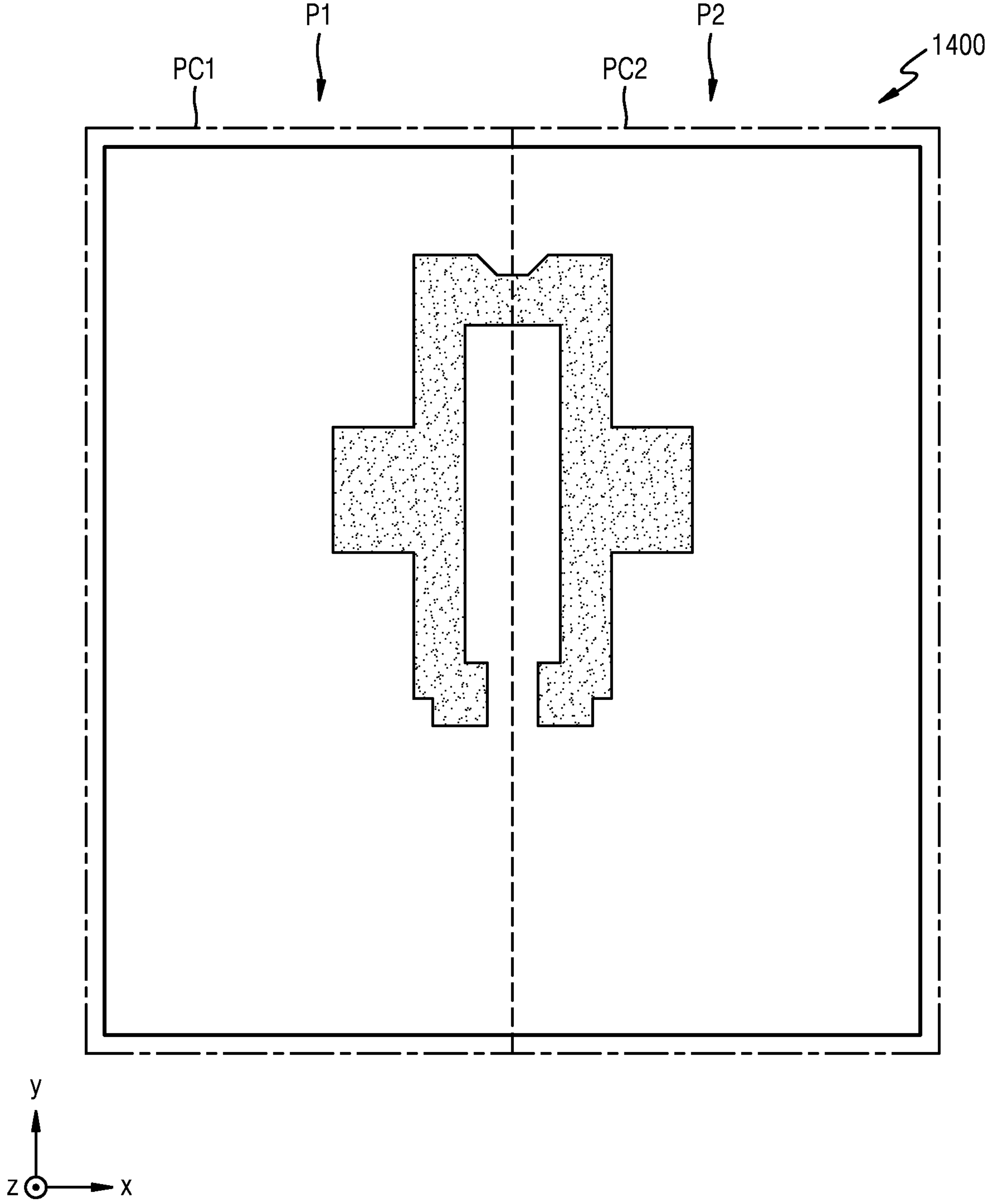

The second semiconductor layer 1400 as shown in FIG. 10 may be located on the first interlayer insulating layer 117. As described above, the second semiconductor layer 1400 may include an oxide semiconductor. The second semiconductor layer 1400 may be located on a different layer from the first semiconductor layer 1100, and when viewed in the direction (the z-axis direction) perpendicular to the substrate 100, the second semiconductor layer 1400 may not overlap the first semiconductor layer 1100.

A third gate insulating layer 118 (see FIG. 14) may cover the second semiconductor layer 1400, and may be located on the first interlayer insulating layer 117. The third gate insulating 118 layer may include an insulating material. However, as shown in FIG. 14, the third gate insulating layer 118 may be located only on a portion of the second semiconductor layer 1400, and may not be located on the first interlayer insulating layer 117. In the latter case, as shown in FIG. 14, the third gate insulating layer 118 may have the same pattern as a third gate layer 1500 described below with reference to FIG. 11. That is, when viewed in the direction (the z-axis direction) perpendicular to the substrate 100, the third gate insulating layer 118 may completely or almost completely overlap the third gate layer 1500. This is because the third gate insulating layer 118 and the third gate layer 1500 are simultaneously patterned. Accordingly, in the second semiconductor layer 1400, source regions and drain regions, except for channel regions overlapping the third gate layer 1500, may not be covered by the third gate insulating layer 118. The source regions and the drain regions may directly contact a second interlayer insulating layer 119 as shown in FIG. 14. The third gate insulating layer 118 may include silicon oxide, silicon nitride, silicon oxynitride, or aluminum oxide.

Figure 11:
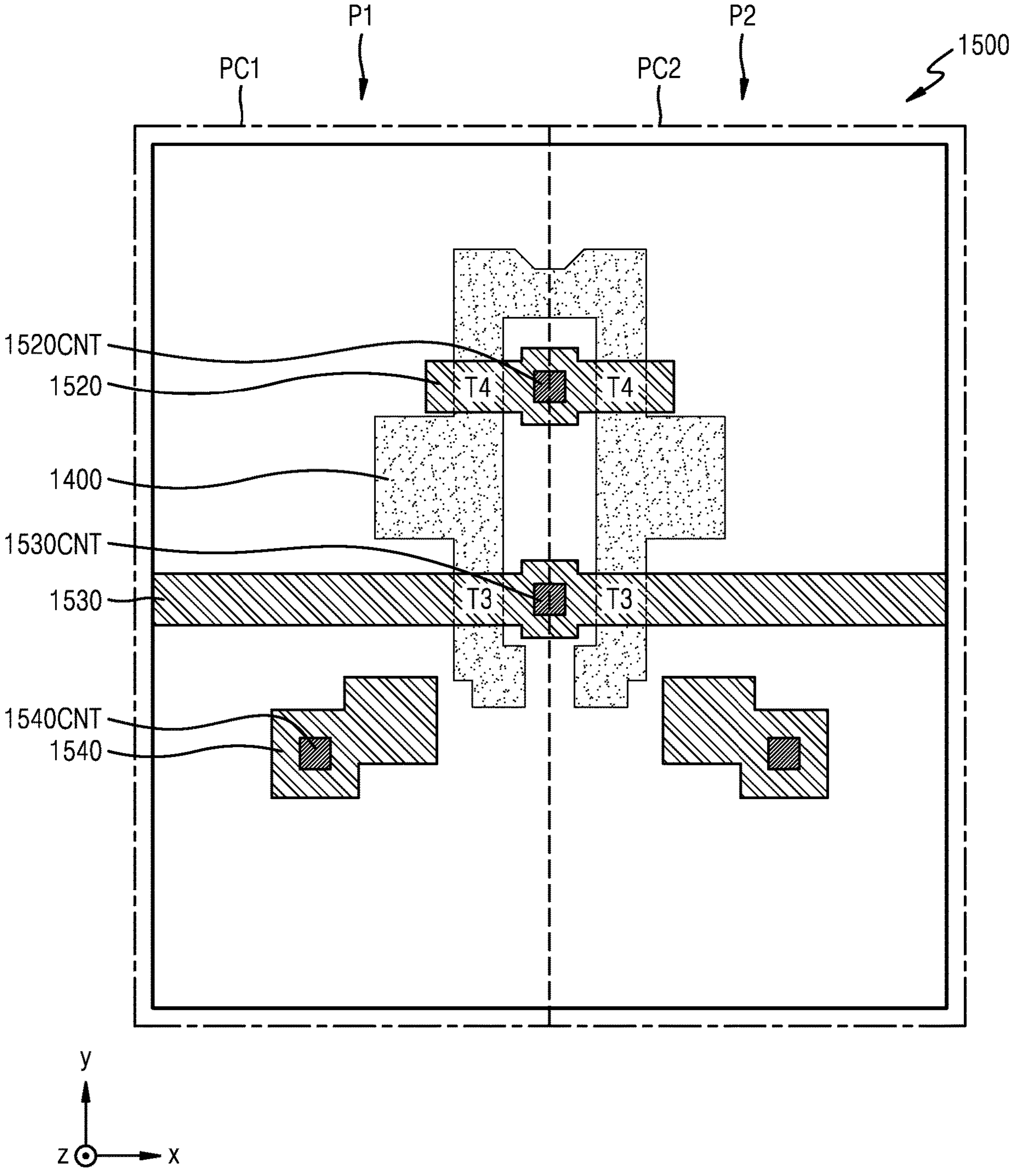

The third gate layer 1500 as shown in FIG. 11 may be located on the third gate insulating layer 118 (see FIG. 14). The third gate layer 1500 may include a fifth gate line 1520, the sixth gate line 1530, and a first transfer line 1540.

The fifth gate line 1520 may extend in the second direction (the x-axis direction), and may have an isolated shape. When viewed in the direction (the z-axis direction) perpendicular to the substrate 100, the fifth gate line 1520 may overlap the third gate line 1310. The fifth gate line 1520 may be electrically connected to the third gate line 1310 through a contact hole 1520CNT formed in an insulting layer between the fifth gate line 1520 and the third gate line 1310. Accordingly, the fifth gate line 1520 may correspond to the previous scan line SLp of FIG. 5 together with the third gate line 1310. That is, the previous scan signal Sn−1 may be applied to pixels through the fifth gate line 1520 and/or the third gate line 1310. A portion of the fifth gate line 1520 overlapping the second semiconductor layer 1400 may be the first initialization upper gate electrode of the first initialization transistor T4. A portion of the second semiconductor layer 1400 overlapping the fifth gate line 1520 and a portion near the portion may be referred to as a first initialization semiconductor layer.

The sixth gate line 1530 may extend in the second direction (the x-axis direction). When viewed in the direction (the z-axis direction) perpendicular to the substrate 100, the sixth gate line 1530 may overlap the fourth gate line 1320. A portion of the sixth gate line 1530 overlapping the second semiconductor layer 1400 may be a compensation upper gate electrode of the compensation transistor T3. The sixth gate line 1530 may be electrically connected to the fourth gate line 1320. For example, the sixth gate line 1530 may be electrically connected to the fourth gate line 1320 through a contact hole 1530CNT formed in an insulating layer between the sixth gate line 1530 and the fourth gate line 1320. Accordingly, the sixth gate line 1530 may correspond to the second scan line SL2 of FIG. 5 together with the fourth gate line 1320. That is, the second scan signal Sn' may be applied to pixels through the sixth gate line 1530 and/or the fourth gate line 1320.

The first transfer line 1540 may be electrically connected to the first gate electrode 1220 that is the driving gate electrode, through a contact hole 1540CNT passing through an opening 1330-OP of the capacitor upper electrode 1330. The first transfer line 1540 may transmit the first initialization voltage Vint1 transmitted through the first initialization transistor T4 to the first gate electrode 1220.

The third gate layer 1500 may include a metal, an alloy, a conductive metal oxide, or a transparent conductive material. For example, the third gate layer 1500 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The third gate layer 1500 may have a multi-layer structure. For example, the third gate layer 1500 may have a two-layer structure including Mo/Al or may have a three-layer structure including Mo/Al/Mo.

The second interlayer insulating layer 119 (see FIG. 14) may cover at least a part of the third gate layer 1500 of FIG. 11. The second interlayer insulating layer 119 may include an insulating material. For example, the second interlayer insulating layer 119 may include silicon oxide, silicon nitride, silicon oxynitride, or aluminum oxide.

Figure 12:
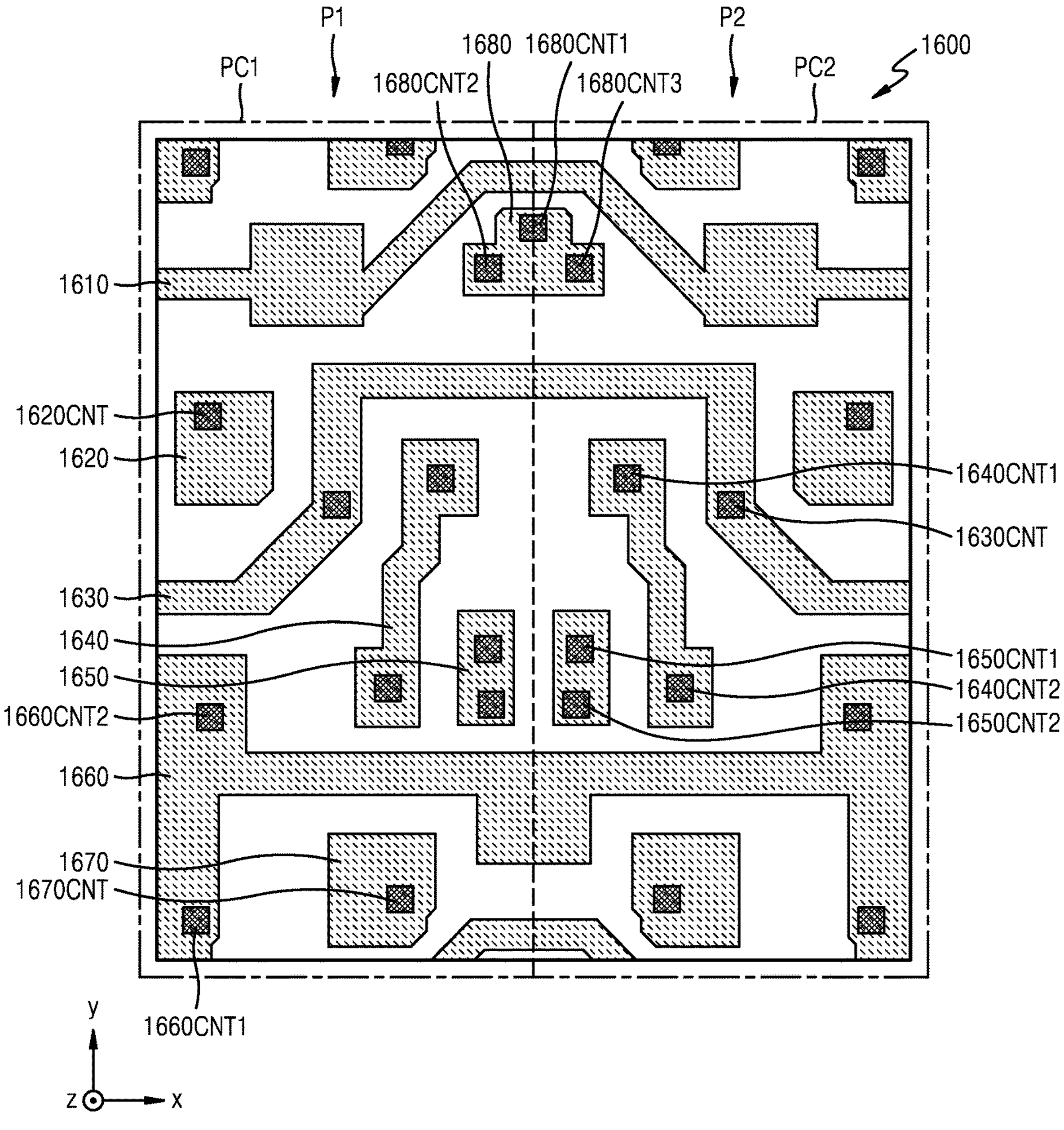

A first connection electrode layer 1600 as shown in FIG. 12 may be located on the second interlayer insulating layer 119. The first connection electrode layer 1600 may include a horizontal connection line 1610, a second transfer line 1620, a second initialization voltage line 1630, a third transfer line 1640, a fourth transfer line 1650, a fifth transfer line 1660, a sixth transfer line 1670, and a seventh transfer line 1680.

The horizontal connection line 1610 may extend in the second direction (the x-axis direction). The 1-$1^{th}$ horizontal connection line HCL1-1, the 1-$2^{th}$ horizontal connection line HCL1-2, and 1-$2^{th}$ auxiliary horizontal connection line HCL1-2*a*, etc., described with reference to FIG. 4 may be implemented through the horizontal connection line 1610 of FIG. 12.

The second transfer line 1620 may be electrically connected to the first semiconductor layer 1100 through a contact hole 1620CNT. The data signal Dm from a data line 1810 described below with reference to FIG. 13 may be transmitted to the first semiconductor layer 1100 through the second transfer line 1620 and may be applied to the switching transistor T2.

The second initialization voltage line 1630 may extend in the second direction (the x-axis direction). The second initialization voltage line 1630 corresponding to the second initialization voltage line VL2 of FIG. 5 may apply the second initialization voltage Vint2 to pixels. The second initialization voltage line 1630 may be electrically connected to the first semiconductor layer 1100 through a contact hole 1630CNT, and the second initialization voltage Vint2 may be transmitted to the first semiconductor layer 1100 and applied to the second initialization transistor T7.

The third transfer line 1640 may electrically connect the second semiconductor layer 1400 and the first transfer line 1540 through contact holes 1640CNT1 and 1640CNT2 formed on a side and the other side. Because the first transfer line 1540 is electrically connected to the first gate electrode 1220 that is the driving gate electrode, the third transfer line 1640 may electrically connect a first initialization semiconductor layer that is a part of the second semiconductor layer 1400 to the driving gate electrode. The first initialization voltage Vint1 may be transmitted to the first gate electrode 1220 that is the driving gate electrode through the second semiconductor layer 1400, the third transfer line 1640, and the first transfer line 1540.

The fourth transfer line 1650 may electrically connect the second semiconductor layer 1400 and the first semiconductor layer 1100 through contact holes 1650CNT1 and 1650CNT2 formed on a side and the other side. That is, the fourth transfer line 1650 may electrically connect the compensation transistor T3 to the driving transistor T1.

The fifth transfer line 1660 may extend in the second direction (the x-axis direction). The driving voltage ELVDD that is a constant voltage from a driving voltage line 1830 described below with reference to FIG. 13 may be transmitted to the fifth transfer line 1660, and the fifth transfer line 1660 may be electrically connected to the first semiconductor layer 1100 through a contact hole 1660CNT1 to transmit the driving voltage ELVDD to the first semiconductor layer 1100, specifically, to the operation control transistor T5. Also, the fifth transfer line 1660 electrically connected to the capacitor upper electrode 1330 (i.e., the second capacitor electrode CE2 of FIG. 5) through a contact hole 1660CNT2 may transmit the driving voltage ELVDD to the capacitor upper electrode 1330.

The sixth transfer line 1670 may be electrically connected to the first semiconductor layer 1100 through a contact hole 1670CNT. The sixth transfer line 1670 may transmit driving current or the second initialization voltage Vint2 from the first semiconductor layer 1100 to the organic light-emitting diode OLED.

The seventh transfer line 1680 may be electrically connected to the second semiconductor layer 1400 through the contact holes 1680CNT2 and 1680CNT3. The seventh transfer line 1680 may be electrically connected to the first initialization voltage line 1340 of FIG. 9 through the contact hole 1680CNT1. Accordingly, the seventh transfer line 1680 may transmit the first initialization voltage Vint1 from the first initialization voltage line 1340 to the first initialization transistor T4.

The first connection electrode layer 1600 may include a metal, an alloy, a conductive metal oxide, or a transparent conductive material. For example, the first connection electrode layer 1600 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first connection electrode layer 1600 may have a multi-layer structure. For example, the first connection electrode layer 1600 may have a two-layer structure including Ti/Al or may have a three-layer structure including Ti/Al/Ti.

A third interlayer insulating layer 121 (see FIG. 14) may cover the first connection electrode layer 1600, and may be located on the second interlayer insulating layer 119. The third interlayer insulating layer 121 may include an insulating material. For example, the third interlayer insulating layer 121 may include silicon oxide, silicon nitride, silicon oxynitride, or aluminum oxide. When necessary, the third interlayer insulating layer 121 may include an organic insulating material. For example, the third interlayer insulating layer 121 may include photoresist, benzocyclobutene (BCB), polyimide, hexamethyldisiloxane (HMDSO), polymethylmethacrylate (PMMA), polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

Figure 13:
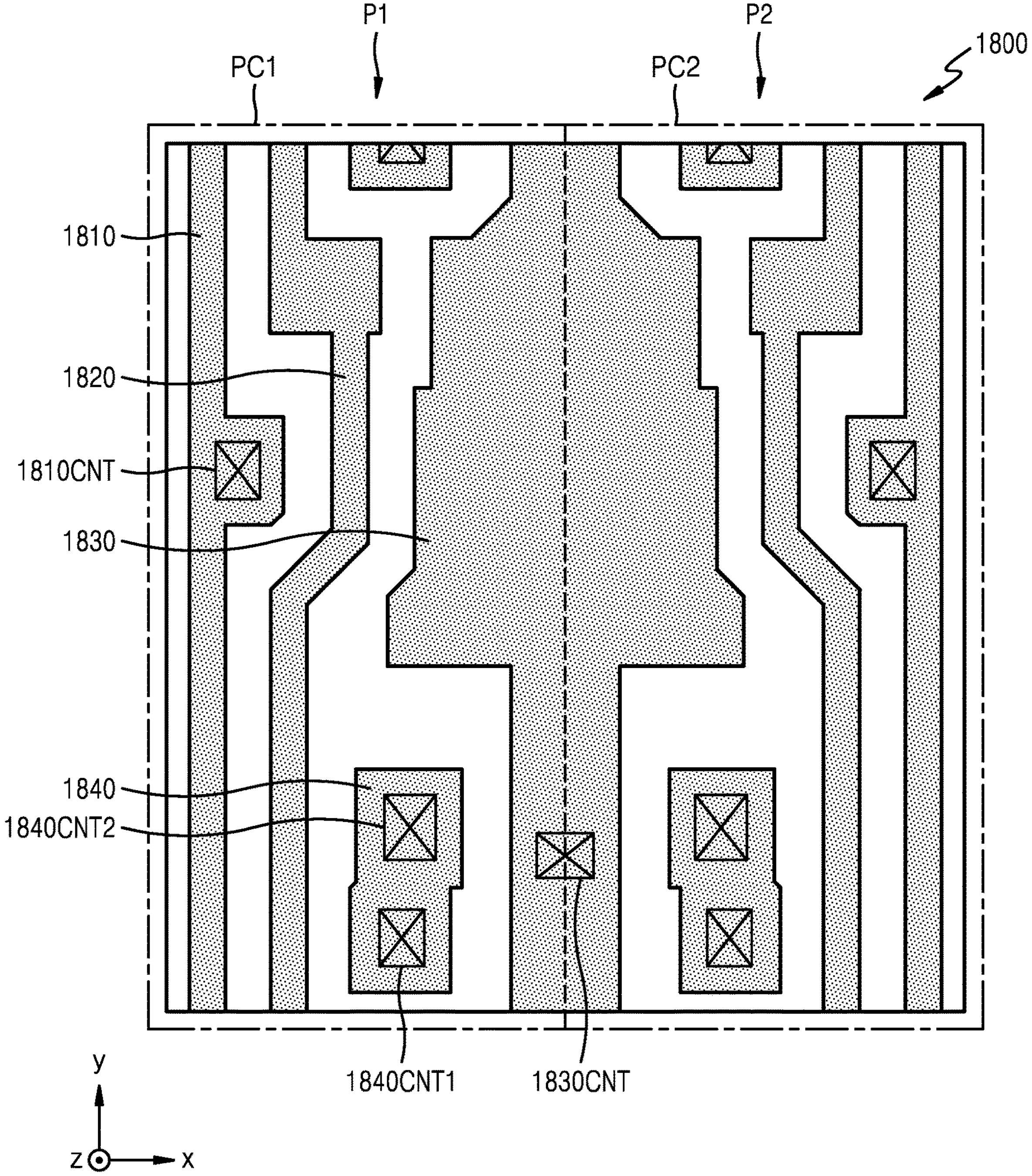
Figure 14:
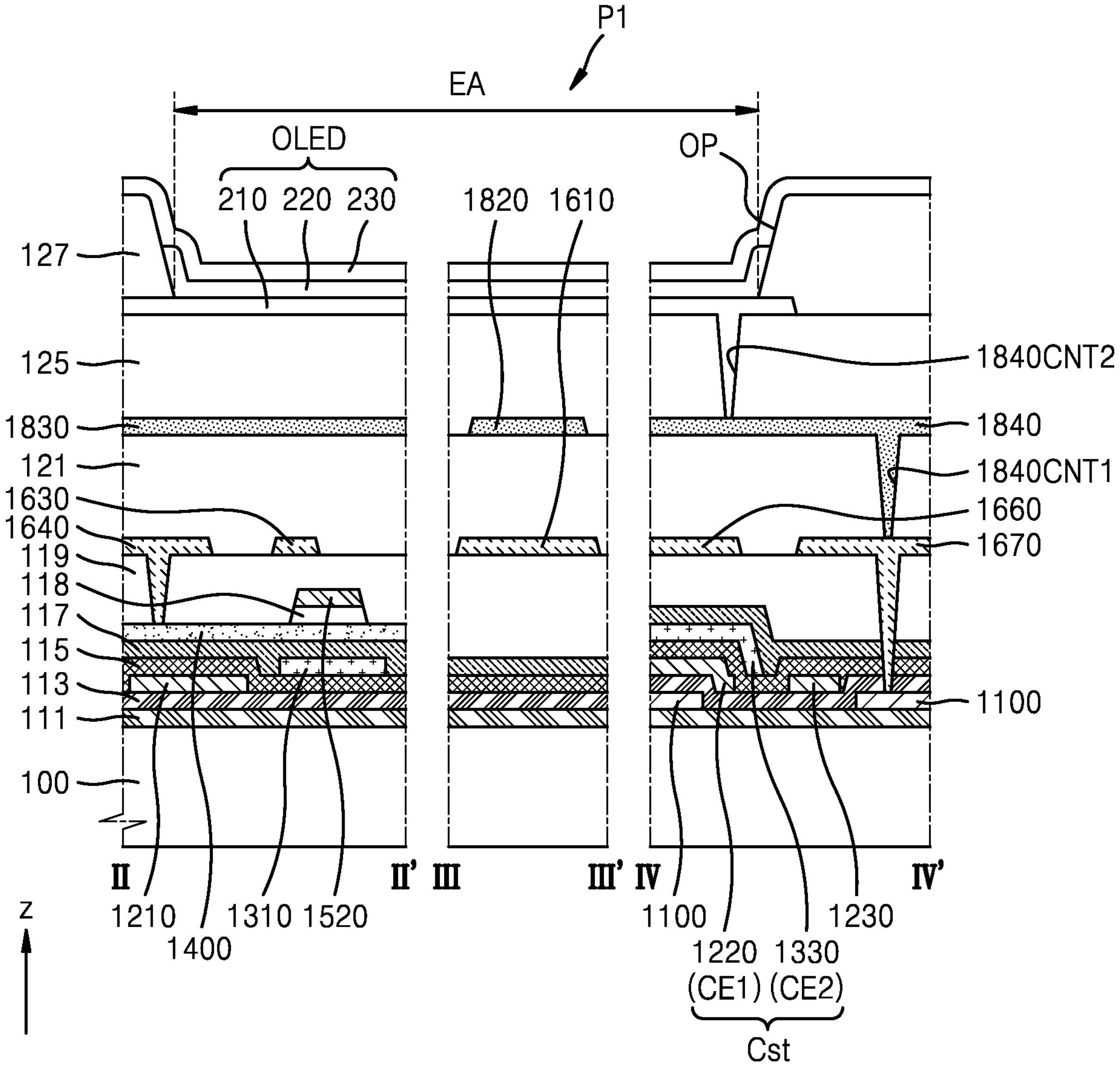
FIG. 14 is a schematic cross-sectional view taken along lines II-II', III-III', and IV-IV' of the display apparatus of FIG. 6.

A second connection electrode layer 1800 as shown in FIG. 13 may be located on the third interlayer insulating layer 121. The second connection electrode layer 1800 may include the data line 1810, a vertical connection line 1820, the driving voltage line 1830, and a tenth transfer line 1840.

The data line 1810 may extend in the first direction (the y-axis direction). The data line 1810 may correspond to the data line DL of FIG. 5. The data line 1810 may be any one of the 1-1$^{th}$ data line D1-1, the 1-2$^{th}$ data line D1-2, the 2-1$^{th}$ data line D2-1, the 2-2$^{th}$ data line D2-2, the 3-1$^{th}$ data line D3-1, the 3-2$^{th}$ data line D3-2, the fourth data line D4, the fifth data line D5, and the sixth data line D6 described with reference to FIG. 4, according to a position of a pixel. That is, the 1-1$^{th}$ data line D1-1, the 1-2$^{th}$ data line D1-2, the 2-1$^{th}$ data line D2-1, the 2-2$^{th}$ data line D2-2, the 3-1$^{th}$ data line D3-1, the 3-2$^{th}$ data line D3-2, the fourth data line D4, the fifth data line D5, and the sixth data line D6 may be disposed on the same layer.

The data line 1810 may be electrically connected to the second transfer line 1620 through a contact hole 1810CNT, and the data signal Dm from the data line 1810 may be transmitted to the first semiconductor layer 1100 through the second transfer line 1620 and applied to the switching transistor T2.

The vertical connection line 1820 may extend substantially in the first direction (the y-axis direction). The vertical connection line 1820 may be any one of the first vertical connection line VCL1, the second vertical connection line VCL2, and the third vertical connection line VCL3 described with reference to FIG. 4, according to a position of a pixel. That is, the first vertical connection line VCL1, the second vertical connection line VCL2, and the third vertical connection line VCL3 may be disposed on the same layer.

The driving voltage line 1830 may extend substantially in the first direction (the y-axis direction). The driving voltage line 1830 may correspond to the driving voltage line PL of FIG. 5. The driving voltage line 1830 may apply the driving voltage ELVDD to pixels. The driving voltage line 1830 may be electrically connected to the fifth transfer line 1660 through a contact hole 1830CNT, and the driving voltage ELVDD may be transmitted to the operation control transistor T5 and the capacitor upper electrode 1330 as described above. The driving voltage line 1830 of the first pixel circuit PC1 and the driving voltage line 1830 of the second pixel circuit PC2 adjacent to the first pixel circuit PC1 may be integrally formed as a single body.

The tenth transfer line 1840 may be electrically connected to the sixth transfer line 1670 through a contact hole 1840CNT1, and may receive, from the sixth transfer line 1670, driving current or the second initialization voltage Vint2 from the first semiconductor layer 1100. Also, the tenth transfer line 1840 may transmit driving current or the second initialization voltage Vint2 from the first semiconductor layer 1100 to the first electrode (pixel electrode) of the organic light-emitting diode OLED through a contact hole 1840CNT2 formed in an insulating layer located over the tent transfer line 1840.

The second connection electrode layer 1800 may include a metal, an alloy, a conductive metal oxide, or a transparent conductive material. For example, the second connection electrode layer 1800 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second connection electrode layer 1800 may have a multi-layer structure. For example, the second connection electrode layer 1800 may have a two-layer structure including Ti/Al or may have a three-layer structure including Ti/Al/Ti.

A planarization insulating layer 125 as shown in FIG. 14 may cover the second connection electrode layer 1800, and the third interlayer insulating layer 121. The planarization insulating layer 125 may include an organic insulating material. For example, the planarization insulating layer 125 may include photoresist, BCB, polyimide, HMDSO, PMMA, polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

As shown in FIG. 14, the organic light-emitting diode OLED may be located on the planarization insulating layer 125. The organic light-emitting diode OLED may include a pixel electrode 210, an intermediate layer 220 including an emission layer, and a counter electrode 230.

The pixel electrode 210 may be a (semi-)transmissive electrode or a reflective electrode. For example, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer located on the reflective layer. The transparent or semi-transparent electrode layer may include at least one selected from the group consisting of indium tin oxide (ITO), indium zinc oxide (IZO), zinc oxide (ZnO or $ZnO_2$), indium oxide ($In_2O_3$), indium gallium oxide (IGO), and aluminum zinc oxide (AZO). For example, the pixel electrode 210 may have a three-layer structure including ITO/Ag/ITO.

A pixel-defining film 127 may be located on the planarization insulating layer 125. The pixel-defining film 127 may increase a distance between an edge of the pixel electrode 210 and the counter electrode 230 over the pixel electrode 210, to prevent an arc or the like from occurring on the edge of the pixel electrode 210.

The pixel-defining film 127 may be formed of at least one organic insulating material selected from the group consisting of polyimide, polyamide, acrylic resin, BCB, and phenolic resin, by using spin coating or the like.

At least a part of the intermediate layer 220 of the organic light-emitting diode OLED may be located in an opening OP formed by the pixel-defining film 127. An emission area EA of the organic light-emitting diode OLED may be defined by the opening OP.

The intermediate layer 220 may include an emission layer. The emission layer may include an organic material including a fluorescent or phosphorescent material that emits red, green, blue, or white light. The emission layer may be formed of a low molecular weight organic material or a high molecular weight organic material, and functional layers such as a hole transport layer (HTL), a hole injection layer (HIL), an electron transport layer (ETL), and an electron injection layer (EIL) may be selectively located under and over the emission layer.

The emission layer may be patterned to correspond to each of the pixel electrodes 210. However, various modifications may be made. For example, layers other than the emission layer included in the intermediate layer 220 may be integrally formed as a single body over the plurality of pixel electrodes 210.

The counter electrode 230 may be a light-transmitting electrode or a reflective electrode. For example, the counter electrode 230 may be a transparent or semitransparent electrode, and may include Li, Ca, LiF, Al, Ag, Mg, or a compound thereof. Also, the counter electrode 230 may further include a transparent conductive oxide (TCO) film such as ITO, IZO, ZnO, $ZnO_2$, or $In_2O_3$ located on a metal thin film. The counter electrode 230 may be integrally formed as a single body over the entire display area DA, and may be located over the intermediate layer 220 and the pixel-defining film 127.

The organic light-emitting diode OLED may be covered by a thin-film encapsulation layer (not shown) or may be covered by a sealing substrate. In an embodiment, the thin-film encapsulation layer may include at least one inorganic encapsulation layer and at least one organic encapsulation layer. For example, the thin-film encapsulation layer may include a first inorganic encapsulation layer, a second inorganic encapsulation layer, and an organic encapsulation layer between the first and second inorganic encapsulation layers.

Each of the first inorganic encapsulation layer and the second inorganic encapsulation layer may include at least one inorganic insulating material such as silicon oxide ($SiO_2$), silicon nitride (SiNx), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by using chemical vapor deposition (CVD) or the like. The organic encapsulation layer may include a polymer-based material. Examples of the polymer-based material may include a silicone-based resin, an acrylic resin (e.g., polymethyl methacrylate or polyacrylic acid), an epoxy resin, polyimide, and polyethylene.

Each of the first inorganic encapsulation layer, the organic encapsulation layer, and the second inorganic encapsulation layer may be integrally formed as a single body to cover the display area DA.

When necessary, a bottom metal layer may be located under the first pixel circuit PC1 and the second pixel circuit PC2. The bottom metal layer may be located between the substrate 100, and the first pixel circuit PC1 and the second pixel circuit PC2 to overlap the first pixel circuit PC1 and the second pixel circuit PC2, in order to protect the first pixel circuit PC1 and the second pixel circuit PC2. The bottom metal layer may prevent or minimize external light or an electric field formed in the substrate 100 from reaching and affecting the first pixel circuit PC1 and the second pixel circuit PC2.

Figure 15:
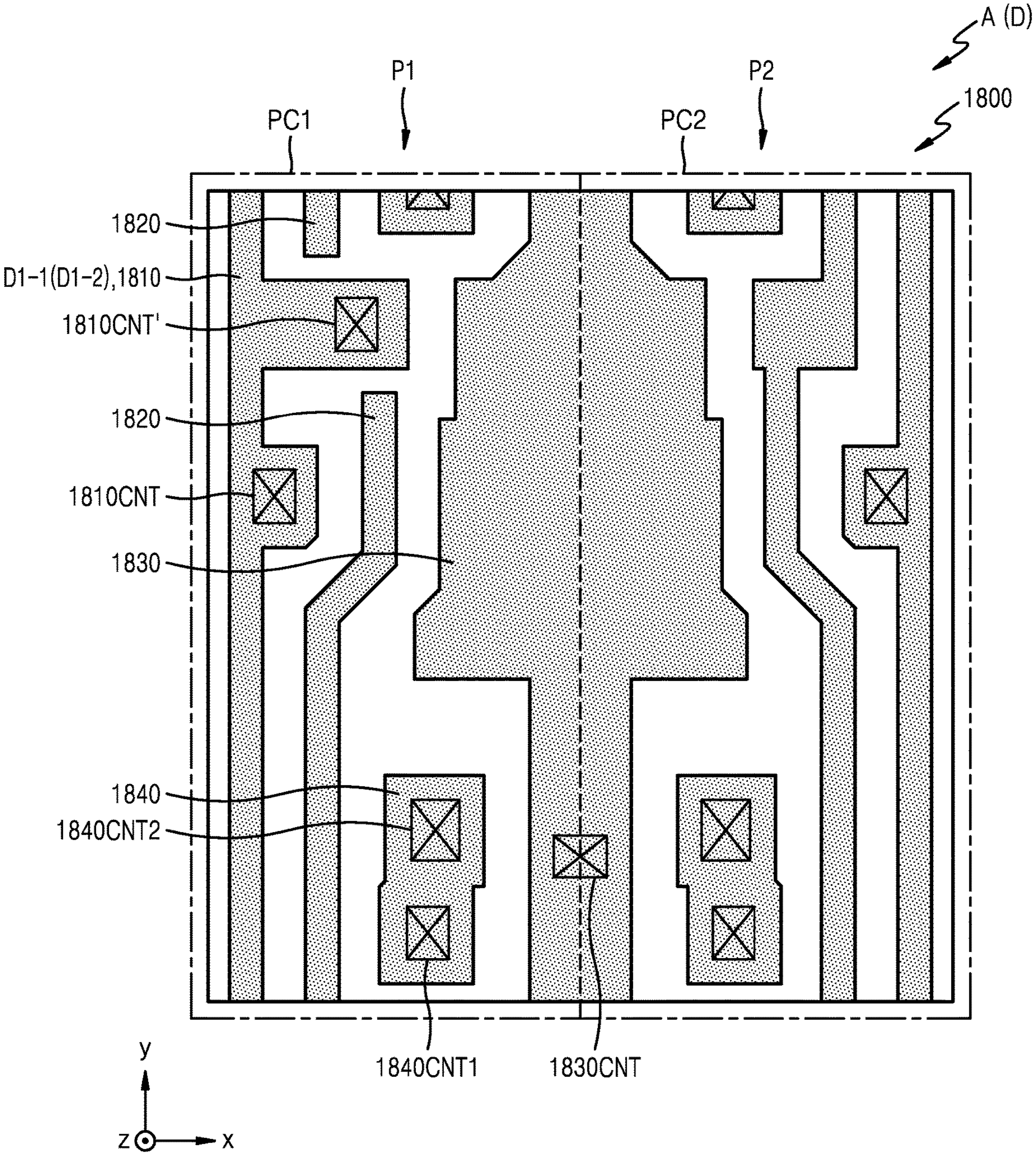
FIGS. 15 and 16 are layout views schematically illustrating some of elements of a pixel of the display panel of FIG. 4.
Figure 16:
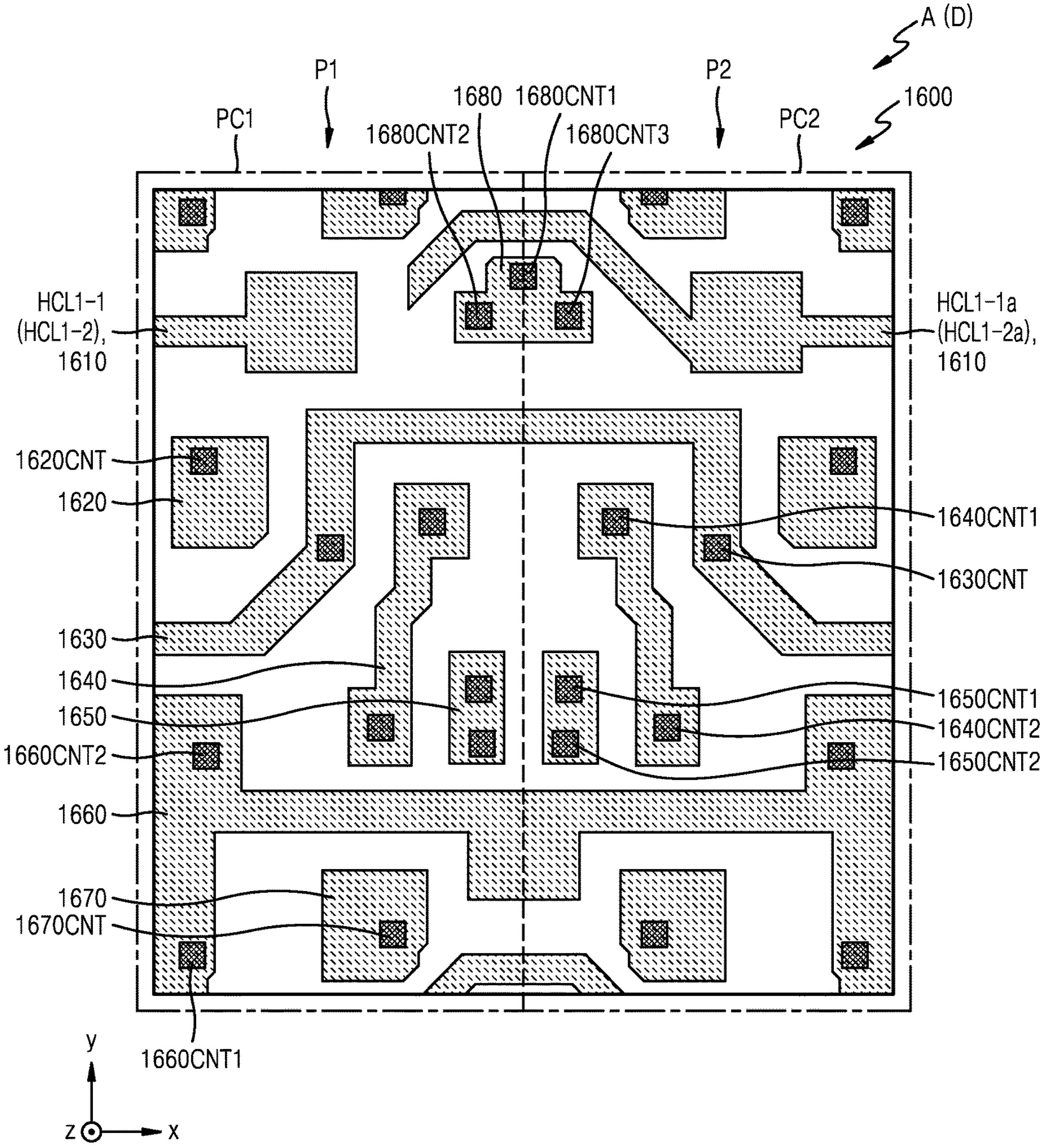

FIGS. 15 and 16 are conceptual views schematically illustrating some layers in the portion A or the portion D of the display panel 10 of FIG. 4, specifically, the second connection electrode layer 1800 and the first connection electrode layer 1600. As shown in FIG. 16, the horizontal connection line 1610 may have a discontinuous point.

In the portion A of FIG. 4, the 1-$1^{th}$ horizontal connection line HCL1-1 is electrically connected to the 1-$1^{th}$ data line D1-1, and in the portion D, the 1-$2^{th}$ horizontal connection line HCL1-2 is electrically connected to the 1-$2^{th}$ data line D1-2. The 1-$1^{th}$ data line D1-1 in the portion A of FIG. 4 and the 1-$2^{th}$ data line D1-2 in the portion D of FIG. 4 may be implemented by the data line 1810 of FIG. 15, and the 1-$1^{th}$ horizontal connection line HCL1-1 in the portion A of FIG. 4 and the 1-$2^{th}$ horizontal connection line HCL1-2 in the portion D of FIG. 4 may be implemented by a portion of the horizontal connection line 1610 in the −x direction of FIG. 16. For reference, the 1-$1^{th}$ auxiliary horizontal connection line HCL1-1*a* in the portion A of FIG. 4 and the 1-$2^{th}$ auxiliary horizontal connection line HCL1-2*a* in the portion D of FIG. 4 may be implemented by a portion of the horizontal connection line 1610 in a +x direction of FIG. 16. As shown in FIGS. 15 and 16, the data line 1810 may be electrically connected to the horizontal connection line 1610 through a contact hole 1810CNT' formed in the third interlayer insulating layer 121 between the data line 1810 and the horizontal connection line 1610. To this end, when necessary, the vertical connection line 1820 may be discontinuous as shown in FIG. 15.

Figure 17:
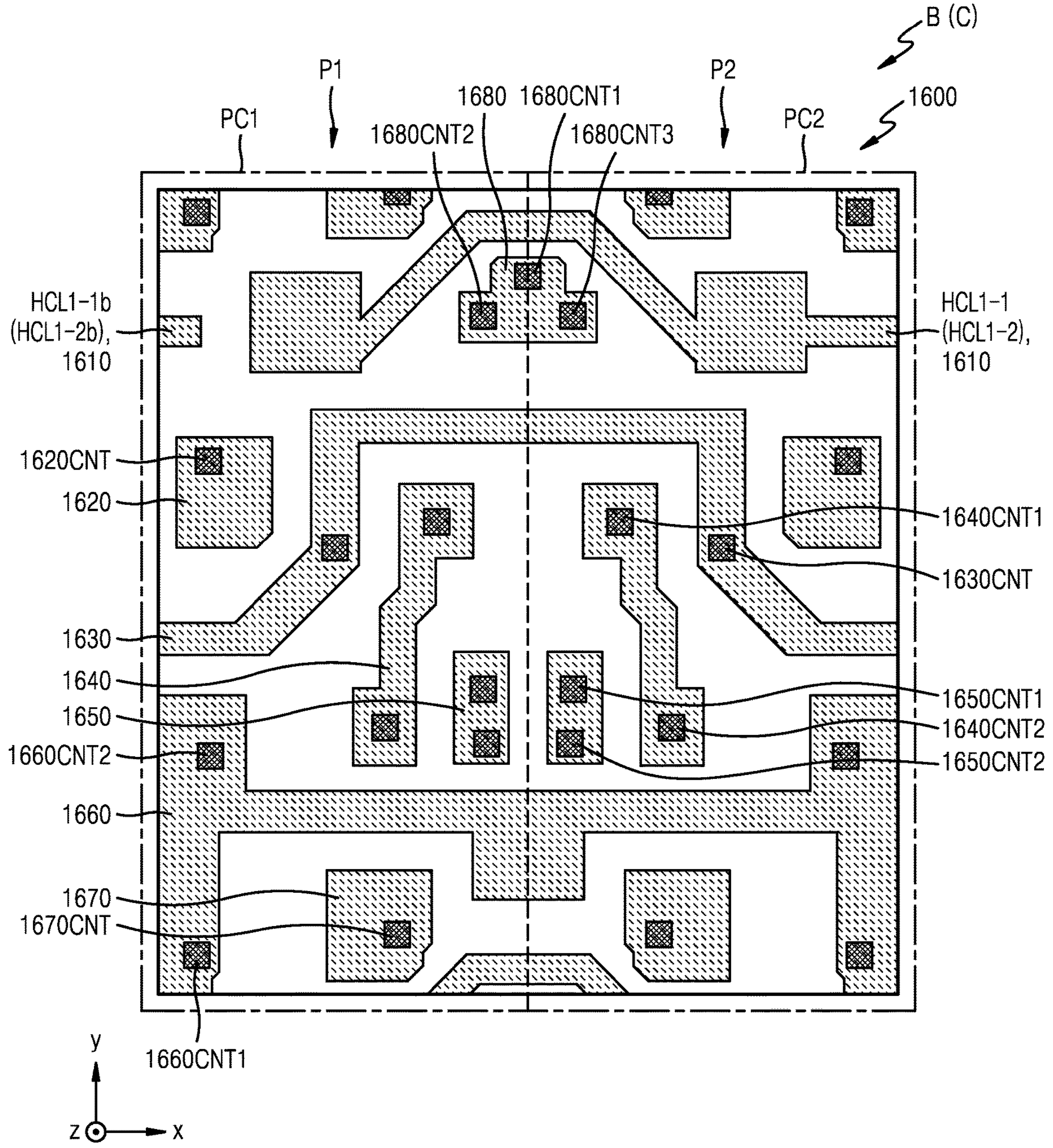
FIG. 17 is a layout view schematically illustrating some of elements of a pixel of the display panel of FIG. 4.
Figure 18:
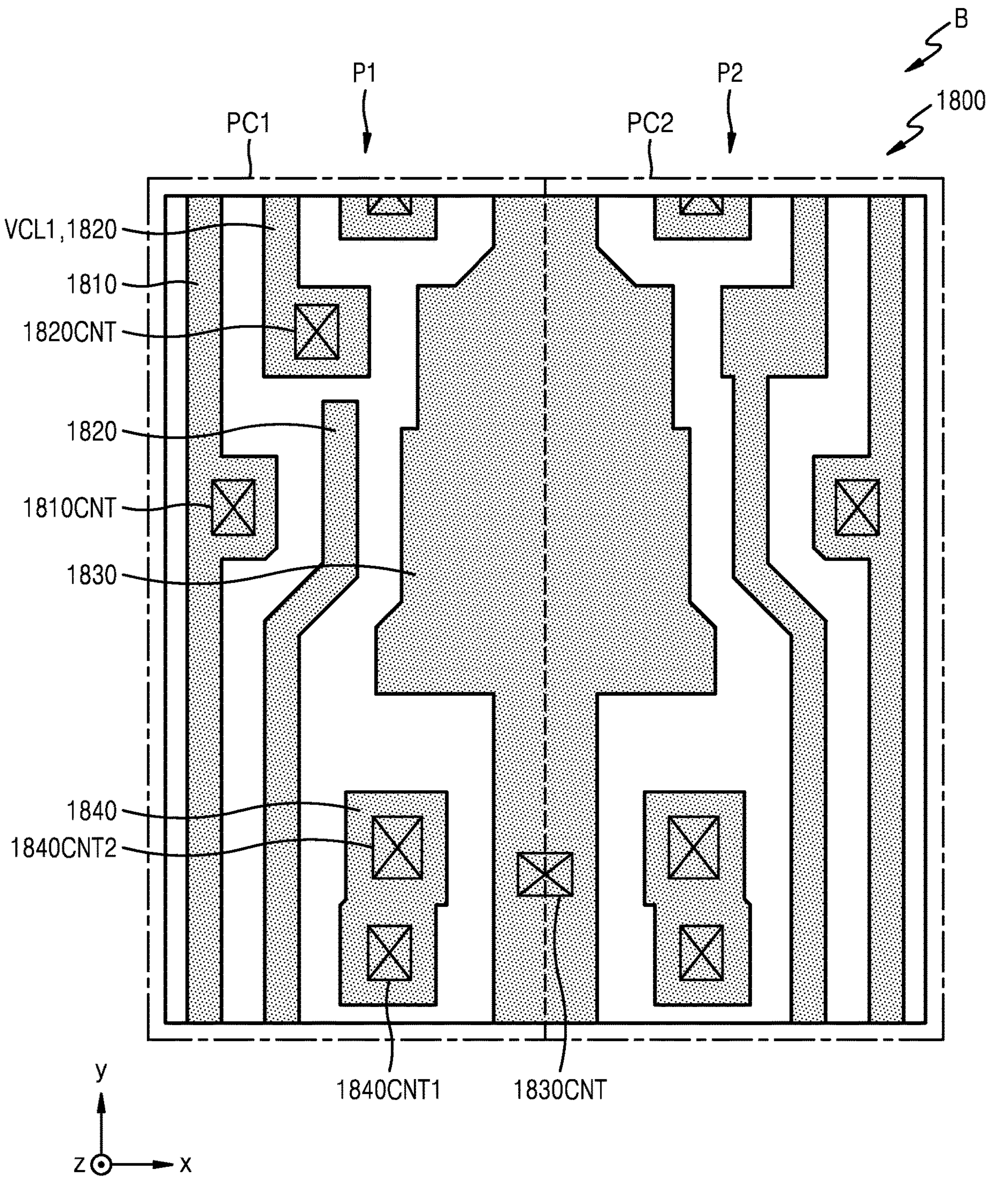
FIG. 18 is a layout view schematically illustrating some of elements of a pixel of the display panel of FIG. 4.
Figure 19:
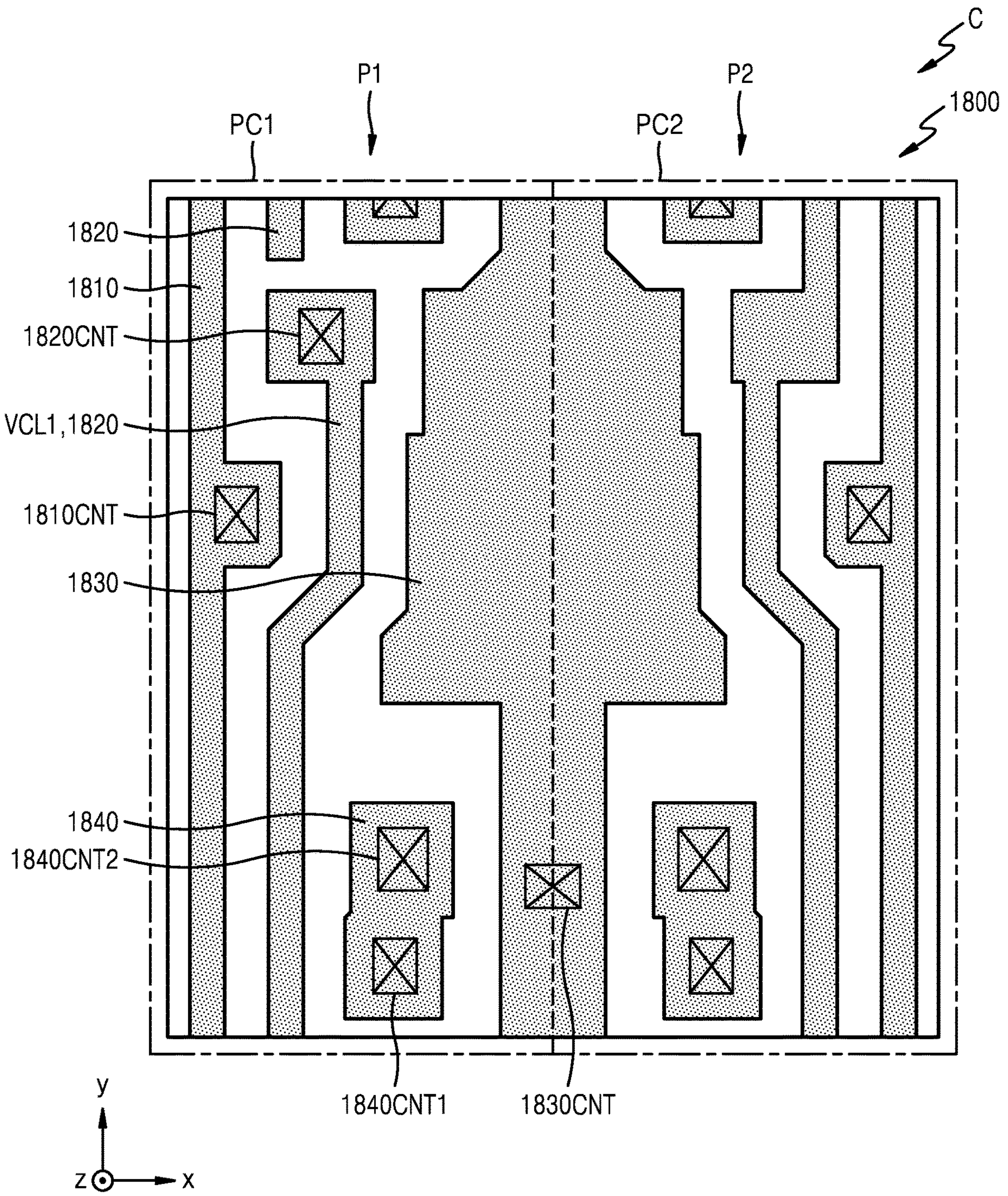
FIG. 19 is a layout view schematically illustrating some of elements of a pixel of the display panel of FIG. 4.

FIG. 17 is a conceptual view schematically illustrating the first connection electrode layer 1600 that is a layer in the portion B or the portion C of the display panel 10 of FIG. 4. As shown in FIG. 17, the horizontal connection line 1610 may have a discontinuous point. FIG. 18 is a conceptual view schematically illustrating the second connection electrode layer 1800 that is a layer in the portion B of the display panel 10 of FIG. 4. FIG. 19 is a conceptual view schematically illustrating the second connection electrode layer 1800 that is a layer in the portion C of the display panel 10 of FIG. 4. As shown in FIGS. 18 and 19, the vertical connection line 1820 may have a discontinuous point.

In the portion B of FIG. 4, the 1-1$^{th}$ horizontal connection line HCL1-1 is electrically connected to the first vertical connection line VCL1. The 1-1$^{th}$ horizontal connection line HCL1-1 in the portion B of FIG. 4 may be implemented by a portion of the horizontal connection line 1610 in the +x direction of FIG. 17, and the first vertical connection line VCL1 in the portion B of FIG. 4 may be implemented by a portion of the vertical connection line 1820 in the +y direction of FIG. 18. For reference, the 1-1$^{th}$ additional horizontal connection line HCL1-1*b* in the portion B of FIG. 4 may be implemented by a portion of the horizontal connection line 1610 in the −x direction of FIG. 17. The first vertical connection line VCL1 may be electrically connected to the 1-1$^{th}$ horizontal connection line HCL1-1 through a contact hole 1820CNT formed in the third interlayer insulating layer 121 between the first vertical connection line VCL1 and the 1-1$^{th}$ horizontal connection line HCL1-1.

In the portion C of FIG. 4, the 1-2$^{th}$ horizontal connection line HCL1-2 is electrically connected to the first vertical connection line VCL1. The 1-2$^{th}$ horizontal connection line HCL1-2 in the portion C of FIG. 4 may be implemented by a portion of the horizontal connection line 1610 in the +x direction of FIG. 17, and the first vertical connection line VCL1 in the portion C of FIG. 4 may be implemented by a portion of the vertical connection line 1820 in the −y direction of FIG. 19. For reference, the 1-2$^{th}$ additional horizontal connection line HCL1-2*b* in the portion C of FIG. 4 may be implemented by a portion of the horizontal connection line 1610 in the −x direction of FIG. 17. The first vertical connection line VCL1 may be electrically connected to the 1-2$^{th}$ horizontal connection line HCL1-2 through the contact hole 1820CNT formed in the third interlayer insulating layer 121 between the first vertical connection line VCL1 and the 1-2$^{th}$ horizontal connection line HCL1-2.

Figure 20:
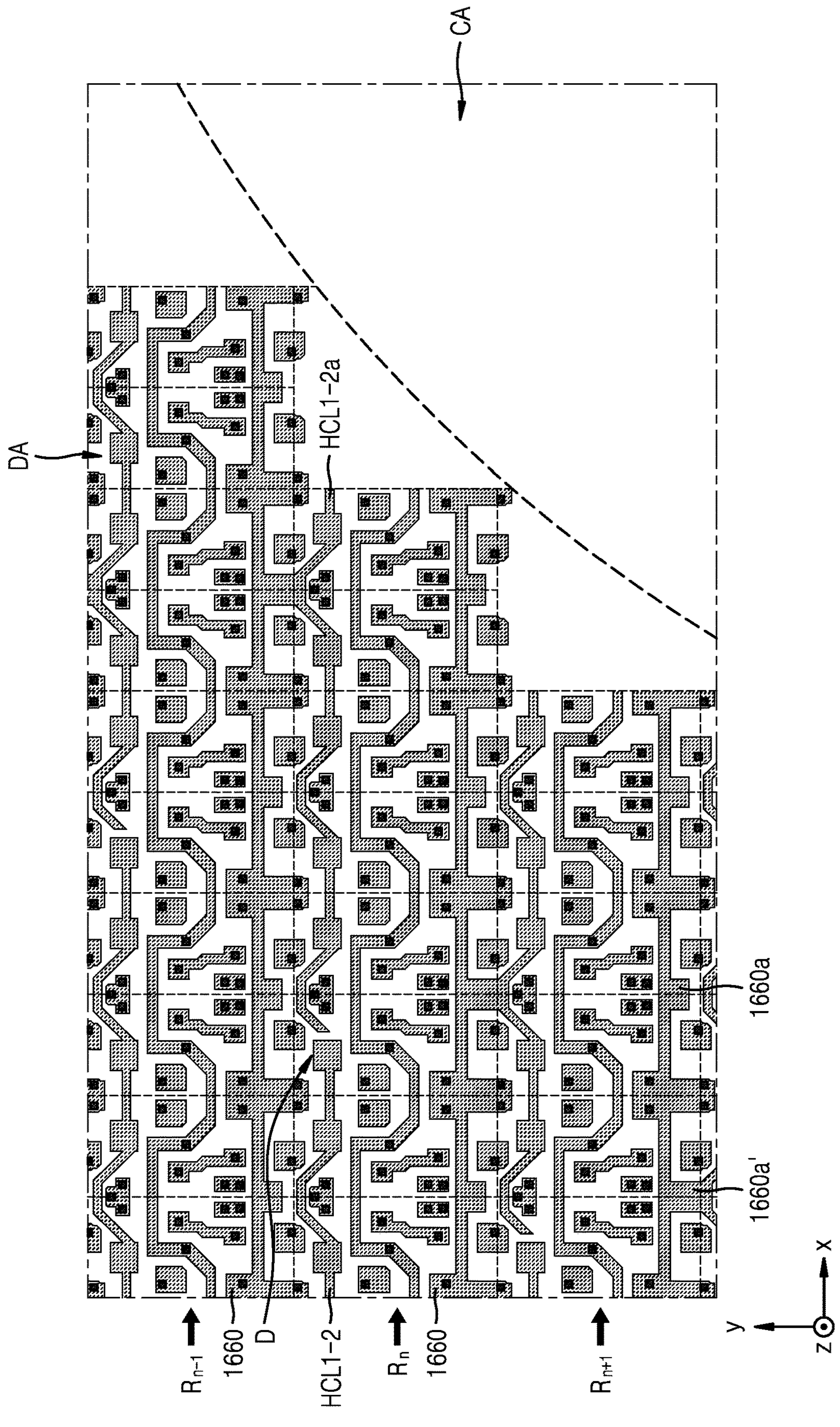
FIG. 20 is a conceptual view schematically illustrating one layer of a portion of the display panel of FIG. 3.

FIG. 20 is a conceptual view schematically illustrating the first connection electrode layer 1600 that is a layer of the display panel of FIG. 3, in a plurality of pixels around the component area CA.

As shown in FIG. 20, a portion of a horizontal connection line corresponding to the portion D of FIG. 4 has a discontinuous point in the portion D. In the portion D, a portion of a horizontal connection line in the −x direction becomes the 1-2$^{th}$ horizontal connection line HCL1-2, and a portion of the horizontal connection line in the +x direction becomes the 1-2$^{th}$ auxiliary horizontal connection line HCL1-2*a* located between the 1-2$^{th}$ horizontal connection line HCL1-2 and the component area CA to be spaced apart from the 1-2$^{th}$ horizontal connection line HCL1-2 and extending in the second direction (the x-axis direction).

The fifth transfer line 1660 located adjacent to the 1-2$^{th}$ horizontal connection line HCL1-2 and the 1-2$^{th}$ auxiliary horizontal connection line HCL1-2*a* to correspond to the 1-2$^{th}$ horizontal connection line HCL1-2 and the 1-2$^{th}$ auxiliary horizontal connection line HCL1-2*a* extends in the second direction (the x-axis direction) to cross the display area DA and extend toward the component area CA as shown in FIG. 20. The fifth transfer line 1660 includes a plurality of protrusions 1660*a* and 1660*a*' protruding in the first direction (the y-axis direction), and at least one of the plurality of protrusions 1660*a* and 1660*a*' is electrically connected to the 1-2$^{th}$ auxiliary horizontal connection line HCL1-2*a*. In FIG. 20, the protrusion 1660*a*' that is one of the plurality of protrusions 1660*a* and 1660*a*' of the fifth transfer line 1660 is electrically connected to the 1-2$^{th}$ auxiliary horizontal connection line HCL1-2*a*.

As described above, the driving voltage line 1830 may be electrically connected to the fifth transfer line 1660 through the contact hole 1830CNT, to apply a constant voltage that is substantially the same as or similar to the driving voltage ELVDD to the fifth transfer line 1660. Because the fifth transfer line 1660 is electrically connected to the 1-2$^{th}$ auxiliary horizontal connection line HCL1-2*a* through a protrusion 1660*a*', a constant voltage that is substantially the same as or similar to the driving voltage ELVDD may be applied to the 1-2$^{th}$ auxiliary horizontal connection line HCL1-2*a*. Accordingly, the 1-2$^{th}$ auxiliary horizontal connection line HCL1-2*a* may be effectively prevented from being floated and increasing electrical instability in nearby pixels. Accordingly, a display apparatus capable of displaying a high-quality image that is not distorted even around the component area CA may be realized. This may be the same for the 2-2$^{th}$ auxiliary horizontal connection line HCL2-2*a*, the 3-2$^{th}$ auxiliary horizontal connection line HCL3-2*a*, the 3-1$^{th}$ auxiliary horizontal connection line HCL3-1*a*, the 2-1$^{th}$ auxiliary horizontal connection line HCL2-1*a*, and the 1-1$^{th}$ auxiliary horizontal connection line HCL1-1*a*. This is the same for the following embodiments and modifications thereof. For convenience, the 1-2$^{th}$ auxiliary horizontal connection line HCL1-2*a* will be described.

A protrusion 1660*a*' of the fifth transfer line 1660 connected to the 1-2$^{th}$ auxiliary horizontal connection line HCL1-2*a* may be located farther from the component area CA than an end of the fifth transfer line 1660 close to the component area CA (in the +x direction), as shown in FIG. 20. As described above, the component area CA may be defined by an opening of the substrate 100 (see FIGS. 3 and 14) included in the display apparatus 1. Because a process of forming openings in the substrate 100 and insulating layers located on the substrate 100 is performed in a manufacturing process that forms the component area CA, a portion around an end of the fifth transfer line 1660 or an area close to the component area CA may be unexpectedly damaged in the process of forming openings. In the display apparatus according to the present embodiment, because a protrusion 1660*a*' of the fifth transfer line 1660 connected to the 1-2$^{th}$ auxiliary horizontal connection line HCL1-2*a* is located farther from the component area CA than an end of the fifth transfer line 1660 close to the component area CA (in the +x direction), the fifth transfer line 1660 and the 1-2$^{th}$ auxiliary horizontal connection line HCL1-2*a* may be reliably electrically connected to each other.

As described with reference to FIG. 12, the fifth transfer line 1660 and the horizontal connection line 1610 may be disposed on the same layer. Accordingly, both the fifth transfer line 1660 and the 1-2$^{th}$ auxiliary horizontal connection line HCL1-2*a* may be located on the second interlayer insulating layer 119. Hence, the fifth transfer line 1660 and the 1-2$^{th}$ auxiliary horizontal connection line HCL1-2*a* connected to the fifth transfer line 1660 may be integrally formed as a single body.

As described with reference to FIGS. 12 and 13, the driving voltage line 1830 is located on the fifth transfer line 1660, and is electrically connected to the fifth transfer line 1660 through the contact hole 1830CNT. The contact hole 1830CNT may correspond to one of the plurality of protrusions of the fifth transfer line 1660. That is, the driving voltage line 1830 may be electrically connected to one of the plurality of protrusions of the fifth transfer line 1660 through the contact hole 1830CNT. The driving voltage lines 1830 extending in the first direction (the y-axis direction) may be respectively electrically connected to the fifth transfer lines 1660 of a plurality of rows through the contact holes 1830CNT.

As shown in FIG. 20, the display apparatus includes a plurality of pixel circuits located in the display area DA to be located in rows extending in the second direction (the x-axis direction). As described above, the fifth transfer line 1660 and the 1-$2^{th}$ auxiliary horizontal connection line HCL1-2$a$ connected to the fifth transfer line 1660 may be integrally formed as a single body. To this end, when n is a natural number of 2 or more, an auxiliary horizontal connection line located in an $n^{th}$ row may be electrically connected to the fifth transfer line 1660 located in an n−$1^{th}$ row. In FIG. 20, the 1-$2^{th}$ auxiliary horizontal connection line HCL1-2$a$ located in an $n^{th}$ row ($R_N$) is electrically connected to the fifth transfer line 1660 located in an n−$1^{th}$ row ($R_{N-1}$). Likewise, an auxiliary horizontal connection line located in an n+$1^{th}$ row ($R_{N+1}$) is electrically connected to the fifth transfer line 1660 located in the $n^{th}$ row ($R_N$).

This is because the second initialization voltage line 1630 extending in the second direction (the x-axis direction) is located between the 1-$2^{th}$ auxiliary horizontal connection line HCL1-2$a$ located in the $n^{th}$ row ($R_N$) and the fifth transfer line 1660 located in the $n^{th}$ row ($R_N$), and thus, a connection structure for electrically connecting them is complicated. In the display apparatus according to the present embodiment, when n is a natural number of 2 or more, because an auxiliary horizontal connection line located in the $n^{th}$ row is electrically connected to the fifth transfer line 1660 located in the n−$1^{th}$ row, a connection structure may be simplified.

Even in a portion other than the portion around the component area CA of the display apparatus, such as in a central portion of the display area DA as shown in FIG. 3, a horizontal connection line extending in the second direction (the x-axis direction) to cross the display area DA may be located. This is to make structures of most pixels the same as or similar to each other as described above. However, because the horizontal connection line for transmitting a data signal is not located around the component area CA, the horizontal connection line may not be used to transmit a data signal, like the 1-$2^{th}$ auxiliary horizontal connection line HCL1-2$a$.

Accordingly, a first end of the horizontal connection line may be located in the peripheral area PA next to the display area DA in the −x direction, and a second end may be located in the peripheral area PA next to the display area DA in the +x direction. In addition, at least one of the first end and the second end of the horizontal connection line may be electrically connected to a constant voltage line in the peripheral area PA. For example, at least one of the first end and the second end of the horizontal connection line may be electrically connected to the common voltage supply line 13 of FIG. 3. The common voltage supply line 13 is maintained at the common voltage ELVSS that is a constant voltage.

The 1-$1^{th}$ additional horizontal connection line HCL1-1$b$, the 2-$1^{th}$ additional horizontal connection line HCL2-1$b$, the 3-$1^{th}$ additional horizontal connection line HCL3-1$b$, the 3-$2^{th}$ additional horizontal connection line HCL3-2$b$, the 2-$2^{th}$ additional horizontal connection line HCL2-2$b$, and the 1-$2^{th}$ additional horizontal connection line HCL1-2$b$ located around the component area CA may not be used to transmit a data signal. Accordingly, in the case of each of the 1-$1^{th}$ additional horizontal connection line HCL1-1$b$, the 2-$1^{th}$ additional horizontal connection line HCL2-1$b$, the 3-$1^{th}$ additional horizontal connection line HCL3-1$b$, the 3-$2^{th}$ additional horizontal connection line HCL3-2$b$, the 2-$2^{th}$ additional horizontal connection line HCL2-2$b$, and the 1-$2^{th}$ additional horizontal connection line HCL1-2$b$, an end away from the component area CA may be located in the peripheral area PA next to a side of the display area DA. This end may be electrically connected to a constant voltage line in the peripheral area PA. For example, this end may be electrically connected to the common voltage supply line 13 as shown in FIG. 3. This is because the common voltage supply line 13 is a line maintained at the common voltage ELVSS that is a constant voltage.

For reference, in the case of each of the 1-$1^{th}$ horizontal connection line HCL1-1, the 2-$1^{th}$ horizontal connection line HCL2-1, the 3-$1^{th}$ horizontal connection line HCL3-1, the 3-$2^{th}$ horizontal connection line HCL3-2, the 2-$2^{th}$ horizontal connection line HCL2-2, and the 1-$2^{th}$ horizontal connection line HCL1-2 functioning to transmit a data signal as described above, one of a first end and the second end of these horizontal connection lines farther from the component area CA is located in the display area DA as shown in FIG. 4. When necessary, for each of the 1-$1^{th}$ horizontal connection line HCL1-1, the 2-$1^{th}$ horizontal connection line HCL2-1, the 3-$1^{th}$ horizontal connection line HCL3-1, the 3-$2^{th}$ horizontal connection line HCL3-2, the 2-$2^{th}$ horizontal connection line HCL2-2, and the 1-$2^{th}$ horizontal connection line HCL1-2, both the first end and the second end thereof may be located in the display area DA.

Although the display apparatus includes one component area CA as shown in FIG. 3, the disclosure is not limited thereto. For example, there may be multiple component areas CA. In the embodiment shown in FIG. 21 that is a plan view schematically illustrating a display apparatus according to an embodiment, the display apparatus may include a first component area CA1 and a second component area CA2 spaced apart from each other in the second direction (the x-axis direction), and the display area DA may surround the first component area CA1 and the second component area CA2. When necessary, a first intermediate area MA1 may be located between the display area DA and the first component area CA1, and a second intermediate area MA2 may be located between the display area DA and the second component area CA2. The description of the component area CA may apply to the first component area CA1 and the second component area CA2. Pixels located in the display area DA may have such a structure as described with reference to FIGS. 5 to 14. For example, the driving voltage line 1830 extending in the first direction (the y-axis direction) may cross the display area DA.

Figure 21:
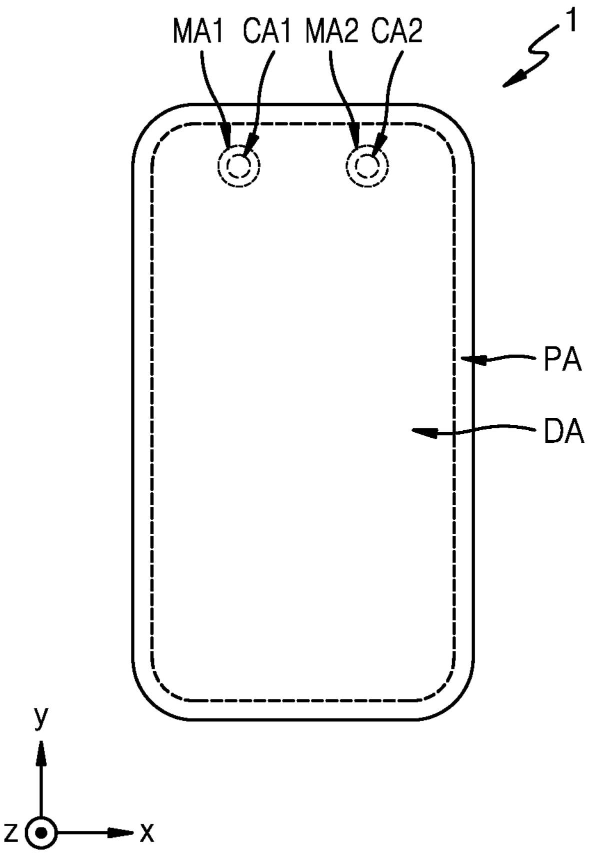
FIG. 21 is a plan view schematically illustrating a display apparatus, according to an embodiment.
Figure 22:
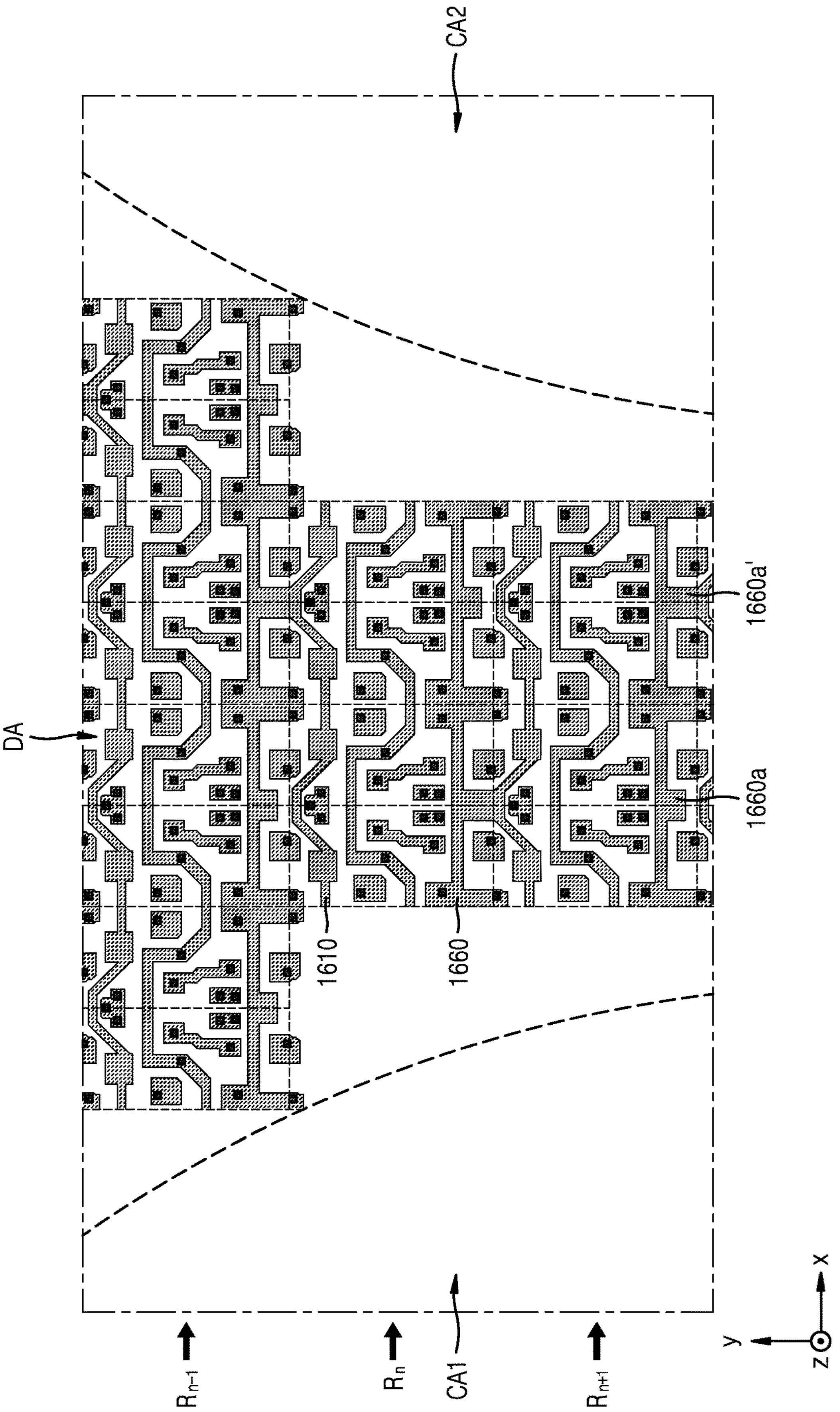
FIG. 22 is a conceptual view schematically illustrating one layer of a portion of a display panel of FIG. 21.

FIG. 22 is a conceptual view schematically illustrating the first connection electrode layer 1600 that is a layer of the display panel of FIG. 21, in a plurality of pixels between the first component area CA1 and the second component area CA2. As shown in FIG. 22, horizontal connection lines 1610 extending in the second direction (the x-axis direction) are located between the first component area CA1 and the second component area CA2 to cross the display area DA. As such, the horizontal connection lines 1610 located between the first component area CA1 and the second component area CA2 do not function to transmit a data signal.

In addition, the fifth transfer lines 1660 extending in the second direction (the x-axis direction) are also located between the first component area CA1 and the second component area CA2 to cross the display area DA. The fifth transfer lines 1660 may correspond to the horizontal connection lines 1610 in a one-to-one manner. In this case, the fifth transfer lines 1660 include a plurality of protrusions 1660*a* and 1660*a*' protruding in the first direction (the y-axis direction), and at least one of the protrusions 1660*a* and 1660*a*' is electrically connected to the corresponding horizontal connection line 1610. In FIG. 22, one protrusion 1660*a*' is electrically connected to the corresponding horizontal connection line 1610.

As described with reference to FIGS. 12 and 13, the driving voltage line 1830 may be electrically connected to the fifth transfer line 1660 through the contact hole 1830CNT, to apply a constant voltage that is substantially the same as or similar to the driving voltage ELVDD to the fifth transfer line 1660. Because the fifth transfer line 1660 is electrically connected through a protrusion 1660*a*' to the horizontal connection line 1610 located between the first component area CA1 and the second component area CA2 as shown in FIG. 22, a constant voltage that is substantially the same as or similar to the driving voltage ELVDD may be applied to the horizontal connection line 1610. The horizontal connection line 1610 located between the first component area CA1 and the second component area CA2 without functioning to transmit a data signal may be effectively prevented from being floated and increasing electrical instability in nearby pixels, and thus, a display apparatus capable of displaying a high-quality image that is not distorted between the first component area CA1 and the second component area CA2 may be achieved.

A protrusion of the fifth transfer line 1660 connected to the horizontal connection line 1610 may be located farther from the second component area CA2 than an end of the fifth transfer line 1660 close to the second component area CA2 (in the +x direction) as shown in FIG. 22, and may be located farther from the first component area CA1 than an end of the fifth transfer line 1660 close to the first component area CA1 (in the −x direction). Each of the first component area CA1 and the second component area CA2 may be defined by an opening of the substrate 100 (see FIGS. 3 and 14) included in the display apparatus 1. Because a process of forming openings in the substrate 100 and insulating layers located on the substrate 100 is performed in a manufacturing process that forms the first component area CA1 and the second component area CA2, a portion of the fifth transfer line 1660 that is close to the first component area CA1 or a portion of the fifth transfer line 1660 that is close to the second component area CA2 may be unexpectedly damaged in the process of forming openings. In the display apparatus according to the present embodiment, because a protrusion 1660*a*' of the fifth transfer line 1660 connected to the horizontal connection line 1610 is located farther from the second component area CA2 than an end of the fifth transfer line 1660 close to the second component area CA2 (in the +x direction), and is located farther from the first component area CA1 than an end of the fifth transfer line 1660 close to the first component area CA1 (in the −x direction), the fifth transfer line 1660 and the horizontal connection line 1610 may be reliably electrically connected to each other.

As described with reference to FIG. 12, the fifth transfer line 1660 and the horizontal connection line 1610 may be disposed on the same layer. Accordingly, both the fifth transfer line 1660 and the horizontal connection line 1610 may be located on the second interlayer insulating layer 119. Hence, as shown in FIG. 22, the fifth transfer line 1660 and the horizontal connection line 1610 connected to the fifth transfer line 1660 may be integrally formed as a single body between the first component area CA1 and the second component area CA2.

As described with reference to FIGS. 12 and 13, the driving voltage line 1830 is located over the fifth transfer line 1660, and is electrically connected to the fifth transfer line 1660 through the contact hole 1830CNT. The contact hole 1830CNT may correspond to one of a plurality of protrusions of the fifth transfer line 1660. That is, the driving voltage line 1830 may be electrically connected to one of the plurality of protrusions of the fifth transfer line 1660 through the contact hole 1830CNT. The driving voltage lines 1830 extending in the first direction (the y-axis direction) may be respectively electrically connected to the fifth transfer lines 1660 of a plurality of rows through the contact holes 1830CNT.

As shown in FIG. 22, the display apparatus includes a plurality of pixel circuits located in the display area DA to be located in rows extending in the second direction (the x-axis direction). As described above, the fifth transfer line 1660 and the horizontal connection line 1610 connected to the fifth transfer line 1660 may be integrally formed as a single body between the first component area CA1 and the second component area CA2. To this end, when n is a natural number of 2 or more, the horizontal connection line 1610 located in an $n^{th}$ row ($R_N$) between the first component area CA1 and the second component area CA2 may be electrically connected to the fifth transfer line 1660 located in an $n-1^{th}$ row ($R_{N-1}$). Likewise, the horizontal connection line 1610 located in an $n+1^{th}$ row ($R_{N+1}$) is electrically connected to the fifth transfer line 1660 located in the $n^{th}$ row ($R_N$).

This is because the second initialization voltage line 1630 extending in the second direction (the x-axis direction) is located between the horizontal connection line 1610 located in the $n^{th}$ row ($R_N$) and the fifth transfer line 1660 located in the $n^{th}$ row ($R_N$), and thus, a connection structure for electrically connecting them is complicated. In the display apparatus according to the present embodiment, when n is a natural number of 2 or more, because the horizontal connection line 1610 located in the $n^{th}$ row is electrically connected to the fifth transfer line 1660 located in the $n-1^{th}$ row, a connection structure may be simplified.

Figure 23:
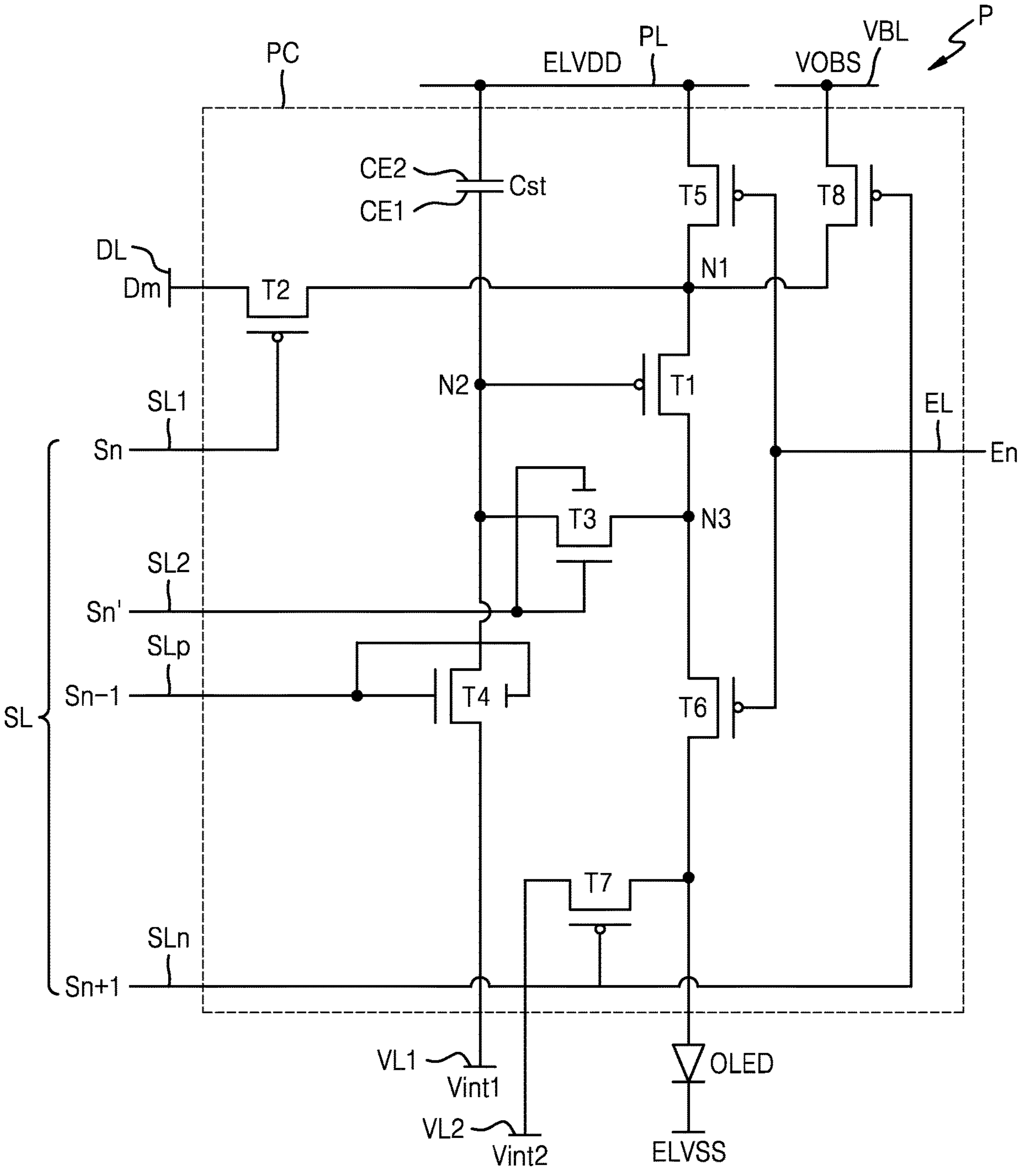
FIG. 23 is an equivalent circuit diagram illustrating a pixel included in a display apparatus, according to an embodiment.

Although each pixel located in the display area DA includes seven transistors and one capacitor as shown in FIG. 5, the disclosure is not limited thereto. Various modifications may be made. For example, as shown in FIG. 23 that is an equivalent circuit diagram illustrating a pixel included in a display apparatus according to an embodiment, each pixel may include eight transistors and one capacitor. There is a difference between the equivalent circuit diagram of FIG. 23 and the equivalent circuit diagram of FIG. 5 in that signal lines further include a bias voltage line VBL in addition to the first scan line SL1, the second scan line SL2, the previous scan line SLp, the next scan line SLn, the emission control line EL, and the data line DL, and a bias transistor T8 is further provided in addition to existing seven transistors. The bias voltage line VBL may transmit a bias voltage VOBS to the bias transistor T8.

The bias transistor T8 may be connected between the first node N1 and the bias voltage line VBL. The bias transistor T8 may be turned on according to the next scan signal Sn+1 received through the next scan line SLn, to apply the bias voltage VOBS to the first node N1 and pre-set a voltage suitable for a subsequent operation of the driving transistor T1 to the first node N1. In this regard, the next scan line SLn may be referred to as a bias gate line. For other points, the description of the equivalent circuit diagram of FIG. 5 may apply to the equivalent circuit diagram of FIG. 23.

According to an embodiment as described above, a display apparatus capable of displaying a high-quality image may be realized. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a substrate comprising a component area and a display area around the component area;

a driving voltage line extending in a first direction across the display area;

a first horizontal connection line extending across the display area in a second direction toward the component area, the second direction intersecting the first direction;

a first auxiliary horizontal connection line spaced apart from the first horizontal connection line in the second direction, located between the first horizontal connection line and the component area along the second direction, and extending in the second direction; and a transfer line extending in the second direction toward the component area, and comprising a plurality of protrusions protruding in the first direction, wherein at least one of the plurality of protrusions is electrically connected to the first auxiliary horizontal connection line.

2. The display apparatus of claim 1, wherein one of the plurality of protrusions is electrically connected to the first auxiliary horizontal connection line.

3. The display apparatus of claim 1, wherein the at least one protrusion is located farther from the component area than an end of the transfer line.

4. The display apparatus of claim 1, wherein the transfer line and the first auxiliary horizontal connection line are disposed on a same layer.

5. The display apparatus of claim 1, wherein the transfer line and the first auxiliary horizontal connection line are integrally formed as a single body.

6. The display apparatus of claim 1, wherein the driving voltage line is disposed on the transfer line.

7. The display apparatus of claim 6, wherein the driving voltage line is electrically connected to one of the plurality of protrusions of the transfer line through a contact hole.

8. The display apparatus of claim 1, further comprising a plurality of pixel circuits located in the display area in rows extending in the second direction, wherein, when n is a natural number of 2 or more, the first auxiliary horizontal connection line located in an $n^{th}$ row is electrically connected to the transfer line located in an $n-1^{th}$ row.

9. The display apparatus of claim 1, further comprising a vertical connection line extending across the display area in the first direction and electrically connected to the first horizontal connection line.

10. The display apparatus of claim 9, wherein the vertical connection line and the driving voltage line are disposed on a same layer.

11. The display apparatus of claim 1, further comprising a second horizontal connection line extending across the display area in the second direction, wherein the substrate further comprises a peripheral area outside the display area, wherein a first end of the second horizontal connection line is located in the peripheral area on one side of the display area, and a second end of the second horizontal connection line is located in the peripheral area on the other side of the display area.

12. The display apparatus of claim 11, wherein both ends of the first horizontal connection line are located in the display area.

13. The display apparatus of claim 11, wherein one end of the first horizontal connection line that is farther from the component area than the other end is located in the display area.

14. The display apparatus of claim 11, further comprising a first additional horizontal connection line spaced apart from the first horizontal connection line, located between the first horizontal connection line and the peripheral area, and extending in the second direction.

15. The display apparatus of claim 14, wherein an end of the first additional horizontal connection line that is farthest away from the component area is located in the peripheral area on a side of the display area.

16. The display apparatus of claim 15, wherein the end of the first additional horizontal connection line is electrically connected to a constant voltage line in the peripheral area.

17. The display apparatus of claim 11, wherein at least one of the first end and the second end of the second horizontal connection line is electrically connected to a constant voltage line in the peripheral area.

18. A display apparatus comprising:

a substrate;

a driving voltage line extending across a display area in a first direction;

a first component area and a second component area spaced apart from each other in a second direction intersecting the first direction, the display area around the first component area and the second component area;

a horizontal connection line extending in the second direction across the display area and located between the first component area and the second component area; and a transfer line extending across the display area in the second direction and located between the first component area and the second component area, and comprising a plurality of protrusions protruding in the first direction, wherein at least one of the plurality of protrusions is electrically connected to the horizontal connection line.

19. The display apparatus of claim 18, wherein one of the plurality of protrusions is electrically connected to the horizontal connection line.

20. The display apparatus of claim 18, wherein the transfer line and the horizontal connection line are disposed on a same layer.

21. The display apparatus of claim 18, wherein the transfer line and the horizontal connection line are integrally formed as a single body.

22. The display apparatus of claim 18, wherein the driving voltage line is disposed over the transfer line.

23. The display apparatus of claim 22, wherein the driving voltage line is electrically connected to one of the plurality of protrusions of the transfer line through a contact hole.

24. The display apparatus of claim 18, further comprising a plurality of pixel circuits located in the display area in rows extending in the second direction, wherein, when n is a natural number of 2 or more, the horizontal connection line located in an $n^{th}$ row is electrically connected to the transfer line located in an $n-1^{th}$ row.

* * * * *